United States Patent
Kim et al.

(10) Patent No.: US 9,847,421 B2
(45) Date of Patent: Dec. 19, 2017

(54) SEMICONDUCTOR DEVICE

(71) Applicant: Samsung Electronics Co., Ltd., Suwon-si (KR)

(72) Inventors: Sung-soo Kim, Suwon-si (KR); Song-E Kim, Seoul (KR); Koung-Min Ryu, Hwaseong-si (KR); Sun-Ki Min, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/189,960

(22) Filed: Jun. 22, 2016

(65) Prior Publication Data
US 2017/0054020 A1 Feb. 23, 2017

(30) Foreign Application Priority Data

Aug. 17, 2015 (KR) .................. 10-2015-0115382

(51) Int. Cl.
*H01L 29/66* (2006.01)
*H01L 21/00* (2006.01)
*H01L 29/78* (2006.01)
*H01L 27/12* (2006.01)

(52) U.S. Cl.
CPC ........ *H01L 29/785* (2013.01); *H01L 27/1233* (2013.01); *H01L 29/66795* (2013.01); *H01L 29/7846* (2013.01)

(58) Field of Classification Search
CPC .................. H01L 29/66795; H01L 29/785
USPC ......... 257/240, 286, 328; 438/147, 156, 173
See application file for complete search history.

(56) References Cited

U.S. PATENT DOCUMENTS

| | | | |
|---|---|---|---|
| 6,815,738 B2 | 11/2004 | Rim | |
| 7,061,038 B2* | 6/2006 | Endoh | H01L 29/7926 257/300 |
| 7,994,561 B2 | 8/2011 | Kim et al. | |
| 8,211,772 B2 | 7/2012 | Kavalieros et al. | |
| 8,895,446 B2 | 11/2014 | Peng et al. | |
| 8,916,918 B2* | 12/2014 | Nishi | H01L 27/10826 257/296 |
| 8,941,155 B2 | 1/2015 | Kang et al. | |
| 9,006,786 B2 | 4/2015 | Ching et al. | |
| 9,117,909 B2* | 8/2015 | Kuo | H01L 21/76224 257/347 |
| 2012/0070947 A1 | 3/2012 | Basker et al. | |
| 2014/0346599 A1 | 11/2014 | Cai et al. | |
| 2015/0014790 A1 | 1/2015 | Peng et al. | |
| 2015/0021691 A1 | 1/2015 | Akarvardar et al. | |
| 2015/0054040 A1 | 2/2015 | Lee et al. | |
| 2016/0079354 A1* | 3/2016 | Park | H01L 27/0886 257/386 |

\* cited by examiner

*Primary Examiner* — Calvin Lee
(74) *Attorney, Agent, or Firm* — Muir Patent Law, PLLC

(57) ABSTRACT

A semiconductor device is provided that includes a deep trench defining an active region, and a fin-type pattern protruding within the active region. The fin-type pattern having a lower portion, an upper portion of a narrower width than the lower portion, and a first stepped portion formed at a boundary between the upper portion and the lower portion. The device also includes a first field insulating film surrounding the lower portion and a second field insulating film formed on the first field insulating film and partially surrounding the upper portion.

20 Claims, 21 Drawing Sheets

SEMICONDUCTOR DEVICE

CROSS-REFERENCE TO RELATED APPLICATION

This application claims priority from Korean Patent Application No. 10-2015-0115382 filed on Aug. 17, 2015 in the Korean Intellectual Property Office, and all the benefits accruing therefrom under 35 U.S.C. 119, the contents of which in its entirety are herein incorporated by reference.

BACKGROUND

1. Technical Field

The present disclosure relates to a semiconductor device.

2. Description of the Related Art

In order to increase the density of semiconductor devices, the use of multigate transistors has been suggested, in which a silicon body in a fin or nanowire shape is formed on a substrate, with a gate then being formed on a surface of the silicon body.

Multigate transistors provide for easy scaling, as they use a three-dimensional channel. Further, current control capability can be enhanced without requiring any increase in gate length of the multigate transistors. Furthermore, with multigate transistors it is possible to effectively suppress short channel effect (SCE) which is the phenomenon that the electric potential of the channel region is influenced by the drain voltage.

SUMMARY

An objective of an exemplary implementation is to provide a semiconductor device in which a location of a fin-type pattern can be adjusted using insulating film that exhibits stress properties or characteristics.

The objectives are not limited to the one objective mentioned above, and other objectives will clearly understood by those skilled in the art based on the detailed description of the exemplary implementations of the disclosed subject matter provided below.

According to one exemplary implementation of the disclosed subject matter, there is provided a semiconductor device, comprising a deep trench defining an active region, a fin-type pattern protruding within the active region, and comprising a lower portion, an upper portion of a narrower width than the lower portion, and a first stepped portion formed at a boundary between the upper portion and the lower portion, a first field insulating film surrounding the lower portion and a second field insulating film formed on the first field insulating film and partially surrounding the upper portion.

According to another exemplary implementation of the disclosed subject matter, there is provided a semiconductor device, comprising a deep trench defining an active region, a first and a second fin-type patterns protruding on the active region, a first trench formed between the first and the second fin-type patterns and comprising a lower portion and an upper portion, and a stepped portion at a boundary between the upper portion and the lower portion, a first field insulating film filling the lower portion and a second field insulating film being on the first field insulating film and partially filling the upper portion.

According to still another exemplary implementation of the disclosed subject matter, there is provided a semiconductor device, comprising a substrate, a first fin-type pattern formed on the substrate, a second fin-type pattern being spaced apart from the first fin-type pattern and inclined more than the first fin-type pattern and a field insulating film surrounding the first and the second fin-type patterns, and exposing the first and the second fin-type patterns, wherein the field insulating film comprises a first field insulating film and a second field insulating film formed on the first field insulating film.

According to yet another exemplary implementation of the disclosed subject matter, there is provided a semiconductor device, comprising a substrate, a first to a third fin-type patterns protruding on the substrate, a first trench formed between the first and the second fin-type patterns and between the second and the third fin-type patterns, and having an upper surface of the substrate as a bottom surface, a first field insulating film filling the first trench, a second trench formed between the first and the second fin-type patterns and between the second and the third fin-type patterns, and having an upper surface of the first field insulating film as a bottom surface and a second field insulating film partially filling the second trench, wherein a width of the bottom surface of the second trench is larger than the width of an uppermost portion of the first trench.

According to yet still another exemplary implementation of the disclosed subject matter, there is provided a semiconductor device, comprising a first to a third fin-type patterns each comprising a lower portion, an upper portion of a narrower width than the lower portion, and a stepped portion at a boundary each between the upper portion and the lower portion, a first field insulating film surrounding the lower portions of the first to the third fin-type patterns and a second field insulating film partially surrounding the upper portions of the first to the third fin-type patterns, wherein a distance between the lower portion of the first fin-type pattern and the lower portion of the second fin-type pattern is identical to a distance between the lower portion of the second fin-type pattern and the lower portion of the third fin-type pattern, and a distance between the upper portion of the first fin-type pattern and the upper portion of the second fin-type pattern is different from a distance between the upper portion of the second fin-type pattern and the upper portion of the third fin-type pattern.

BRIEF DESCRIPTION OF THE DRAWINGS

The above and other objects, features and advantages of the present disclosure will become more apparent to those of ordinary skill in the art by describing in detail exemplary implementations thereof with reference to the accompanying drawings, in which.

DETAILED DESCRIPTION

Figure 1:
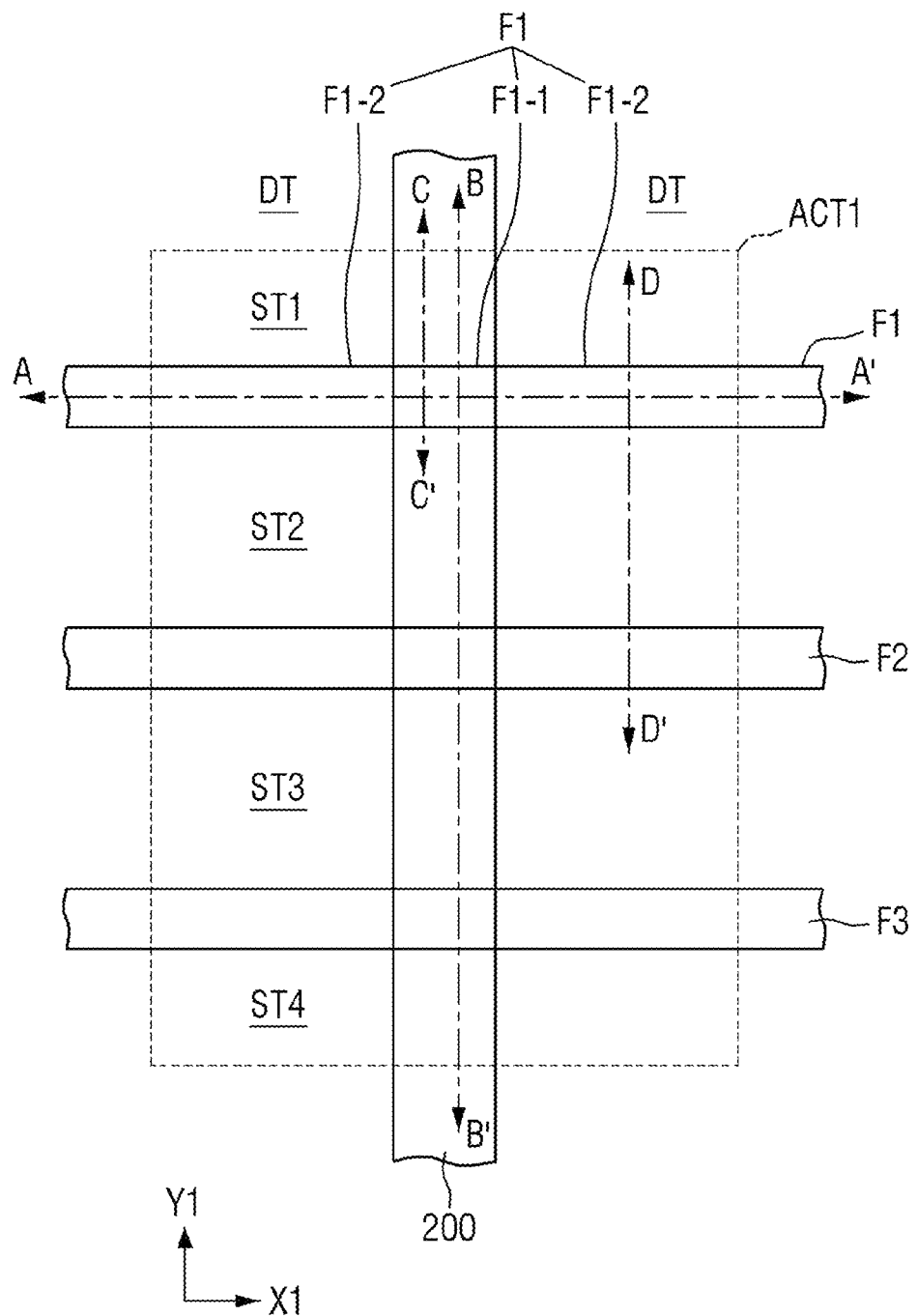
FIG. 1 is a layout diagram provided to explain a semiconductor device according to an exemplary implementation.

The exemplary implementations of the disclosed subject matter will now be described more fully hereinafter with reference to the accompanying drawings. The exemplary implementations of the disclosed subject matter may, however, be embodied in different forms and should not be construed as limited to the forms set forth herein. Rather, these exemplary implementation of the disclosed subject matter are provided so that this disclosure will be thorough and complete, and will fully convey the scope of the exemplary implementations of the disclosed subject matter to those skilled in the art. The same reference numbers indicate the same components throughout the specification. In the attached figures, the thickness of layers and regions is exaggerated for clarity.

It will be understood that when an element or layer is referred to as being "connected to," or "coupled to" another element or layer, it can be directly connected to or coupled to another element or layer or intervening elements or layers may be present. In contrast, when an element is referred to as being "directly connected to" or "directly coupled to" another element or layer, there are no intervening elements or layers present. Like numbers refer to like elements throughout. As used herein, the term "and/or" includes any and all combinations of one or more of the associated listed items.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept.

The use of the terms "a" and "an" and "the" and similar referents in the context of describing the exemplary implementations of the disclosed subject matter (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to the relevant technological field. It is noted that the use of any and all examples, or exemplary terms provided herein is intended merely to better illuminate the exemplary implementations of the disclosed subject matter and is not a limitation thereon unless otherwise specified. Further, unless defined otherwise, all terms defined in generally used dictionaries may not be overly interpreted.

Hereinbelow, a semiconductor device according to an exemplary implementation will be explained with reference to FIGS. 1 to 5.

Figure 2:
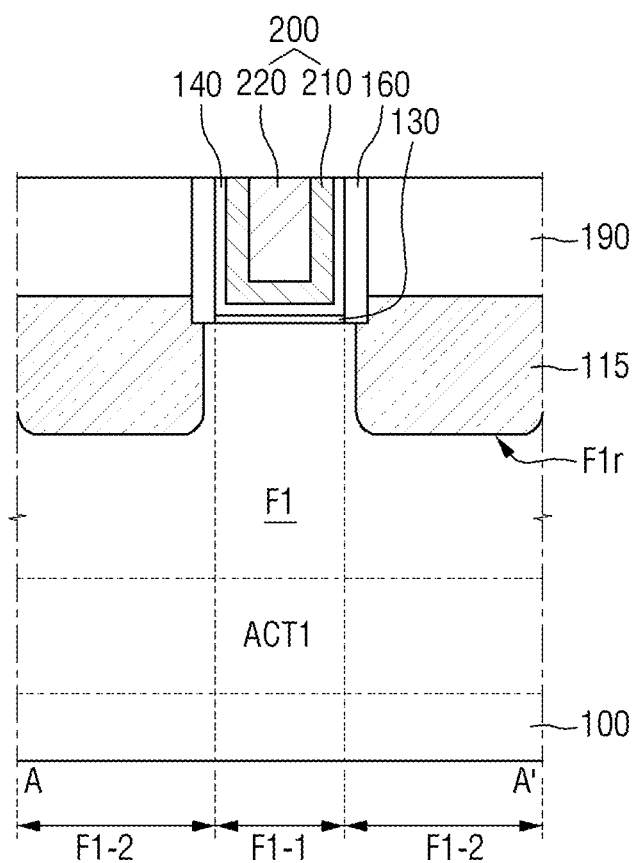
FIG. 2 is a cross sectional view taken on line A-A' of FIG. 1.
Figure 3:
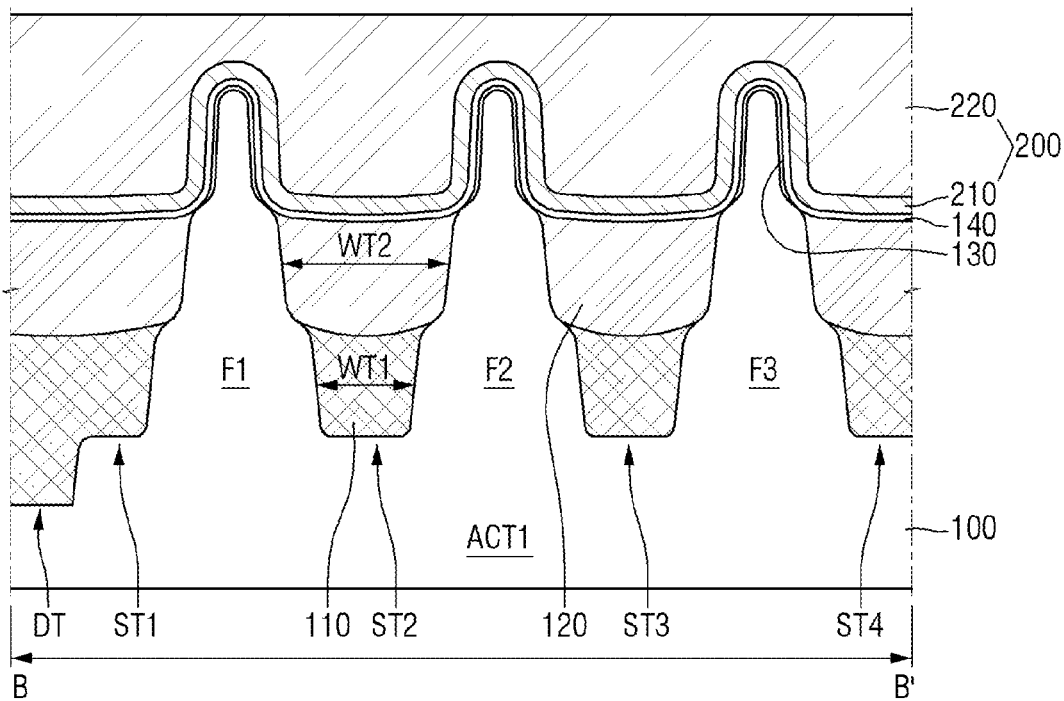
FIG. 3 is a cross sectional view taken on line B-B' of FIG. 1.
Figure 4:
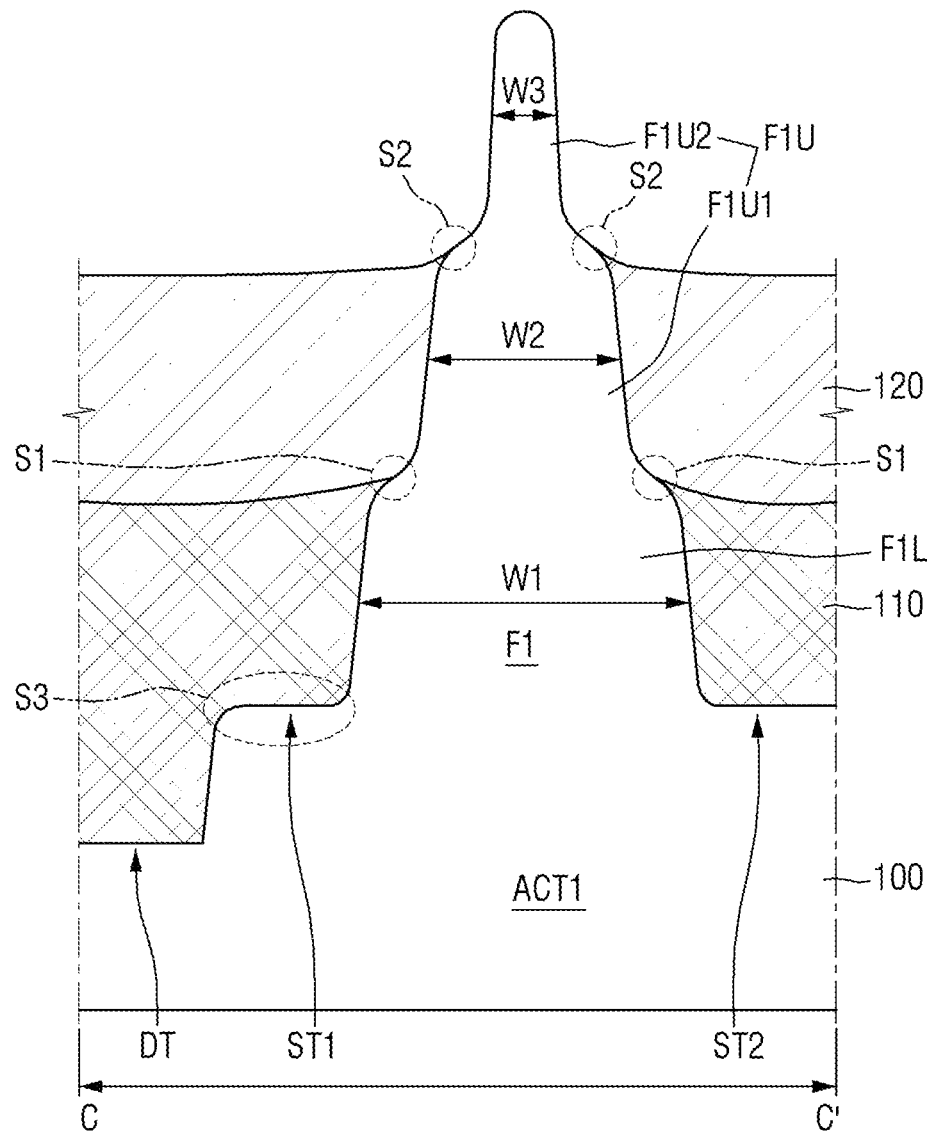
FIG. 4 is a cross sectional view taken on line C-C' of FIG. 1.
Figure 5:
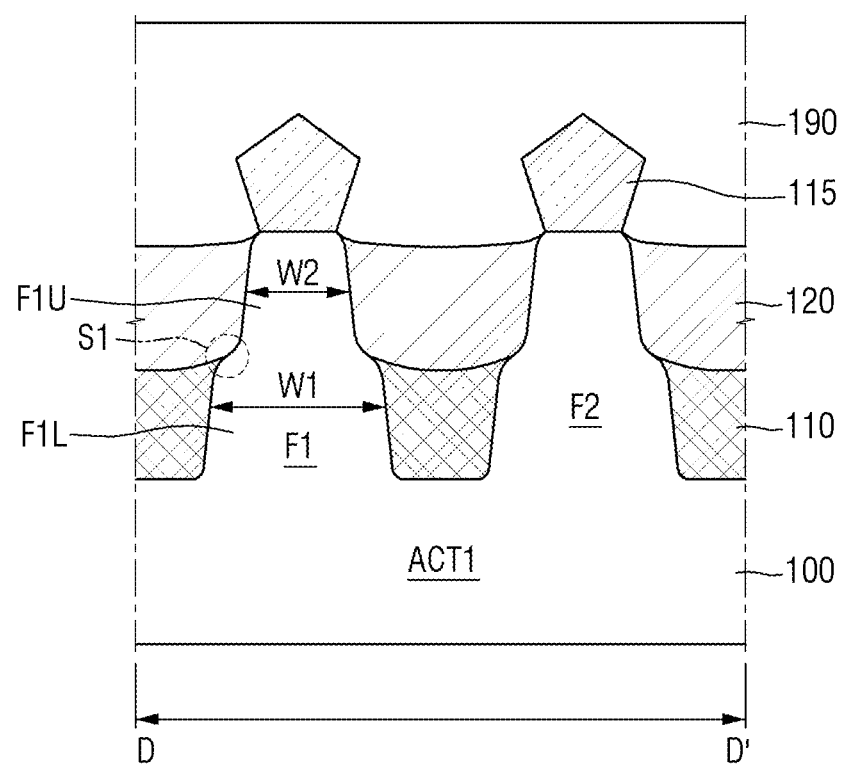
FIG. 5 is a cross sectional view taken on line D-D' of FIG. 1.

FIG. 1 is a layout diagram provided to explain a semiconductor device according to an exemplary implementation. FIG. 2 is a cross sectional view taken on line A-A' of FIG. 1. FIG. 3 is a cross sectional view taken on line B-B' of FIG. 1 FIG. 4 is a cross sectional view taken on line C-C' of FIG. 1. FIG. 5 is a cross sectional view taken on line D-D' of FIG. 1. For convenience of explanation, FIG. 4 skips illustration of gate insulating films 130, 140 and a gate electrode 200.

Referring to FIGS. 1 to 5, a semiconductor device according to an exemplary implementation may include a substrate 100, a first to a third fin-type patterns F1-F3, a first to a fourth shallow trenches ST1-ST4, a first field insulating film 110, a second field insulating film 120, a gate electrode 200, gate insulating films 130, 140, a gate spacer 160, a source/drain 115, and so on.

The substrate 100 may be a bulk silicon or a silicon-on-insulator (SOI), for example. Alternatively, the substrate 100 may be a silicon substrate, or may include other substance such as silicon germanium, indium antimonide, lead telluride compound, indium arsenide, indium phosphide, gallium arsenide, or gallium antimonide. Alternatively, the substrate 100 may be a base substrate having an epitaxial layer formed thereon.

FIG. 1 shows that the first to the third fin-type patterns F1-F3 may extend longitudinally in a first direction X1. FIG. 1 also shows that the first to the third fin-type patterns F1-F3 may have a rectangular shape, although exemplary implementations are not limited thereto. If the first to the third fin-type patterns F1-F3 are in rectangular shape, the first to the third fin-type patterns F1-F3 may include long sides extending in the first direction X1 and short sides extending in a second direction Y1. The second direction Y1 may be the direction that is not parallel to, but intersects the first direction X1.

The first to the third fin-type patterns F1-F3 may be spaced apart from one another in the second direction Y1. In this case, the first to the third fin-type patterns F1-F3 may be disposed at a uniform spacing in the second direction Y1.

The first to the third fin-type patterns F1-F3 may be defined by the first to the fourth shallow trenches ST1-ST4. Specifically, the first fin-type pattern F1 and the second fin-type pattern F2 may be spaced apart from each other by the second shallow trench ST2. The second fin-type pattern F2 and the third fin-type pattern F3 may be spaced apart from each other by the third shallow trench ST3. The second shallow trench ST2 may be formed on a side surface of the first fin-type pattern F1 which is opposed to the second fin-type pattern F2. The first shallow trench ST1 may be formed on a side surface which is not opposed to the second shallow trench ST2 with reference to the first fin-type pattern F1. The third shallow trench ST3 may be formed on a side surface of the third fin-type pattern F3 which is opposed to the second fin-type pattern F2. The fourth shallow trench ST4 may be formed on a side surface which is not opposed to the second shallow trench ST2 with reference to the third fin-type pattern F3.

As illustrated in for example, FIG. 3, the first shallow trench ST1 may be connected with a deep trench DT. The deep trench DT may be the trench that defines a first active region ACT1. That is, a boundary of the first active region AC1 may be defined by the deep trench DT. The first active region ACT1 may be the region that includes the first to the third fin-type patterns F1-F3, and the first to the fourth shallow trenches ST1-ST4.

The first to the third fin-type patterns F1-F3 may be those that are formed by partially etching the substrate 100, and may include an epitaxial layer grown from the substrate 100. The first to the third fin-type patterns F1-F3 may include, for example, an elemental semiconductor material such as silicon or germanium. Further, the first to the third fin-type patterns F1-F3 may include a compound semiconductor such as IV-IV group compound semiconductor or III-V group compound semiconductor, for example.

In the IV-IV group compound semiconductor, for example, the first to the third fin-type patterns F1-F3 may be a binary compound or a ternary compound comprising at least two or more of carbon (C), silicon (Si), germanium (Ge) and tin (Sn), or these compounds doped with IV group element.

In the III-V group compound semiconductor, for instance, the first to the third fin-type patterns F1-F3 may be a binary compound, a ternary compound or a quaternary compound which is formed by a combination of a III group element which may be at least one of aluminum (Al), gallium (Ga), and indium (In), with a V group element which may be one of phosphorus (P), arsenic (As) and antimony (Sb).

In the semiconductor device according to exemplary implementations, it is assumed that the first to the third fin-type patterns F1-F3 include silicon.

The gate electrode 200 may extend in the second direction. The gate electrode 200 may intersect the first to the third fin-type patterns F1-F3, respectively. That is, the gate electrode 200 may include portions respectively overlapping with the first to the third fin-type patterns F1-F3 which are spaced apart from each other. The first to the third fin-type patterns F1-F3 may include overlapping portions and non-overlapping portions with the gate electrode 200, respectively.

Specifically, the first fin-type pattern F1 may include a first portion F1-1 overlapping with the gate electrode 200, and a second portion F1-2 non-overlapping with the gate electrode 200. The second portion F1-2 of the first fin-type pattern F1 may be disposed on opposite sides in the first direction X1 with reference to the first portion F1-1 of the first fin-type pattern F1 the center.

As shown in FIGS. 2 to 5, the gate electrode 200 may include a first metal layer 210 and a second metal layer 220. Alternatively, the gate electrode 200 may be formed by two or more metal layers stacked on one another. The first metal layer 210 plays a role of adjusting work function, and the second metal layer 220 plays a role of filling the space formed by the first metal layer 210. For example, the first metal layer 210 may include at least one of, for example, TiN, WN, TiAl, TiAlN, TaN, TiC, TaC, TaCN, TaSiN and a combination thereof, but is not limited thereto. Further, the second metal layer 220 may include at least one of, for example, W, Al, Cu, Co, Ti, Ta, poly-Si, SiGe and a metal alloy, but is not limited thereto.

For example, the gate electrode 200 described above may be formed by the replacement process (or the gate last process), but not limited thereto.

The gate insulating films (not shown) may be formed between the first to the third fin-type patterns F1-F3 and the gate electrode 200, and between the second field insulating film 120 and the gate electrode 200. The gate insulating films may include an interfacial film 130 and a high-k dielectric film 140.

The interfacial film 130 may be formed by partially oxidizing the first to the third fin-type patterns F1-F3. The interfacial film 130 may be formed along the profile of the first to the third fin-type patterns F1-F3 protruding upward farther than the upper surface of the second field insulating film 120. When the first to the third fin-type patterns F1-F3 are silicon fin-type patterns that include silicon, the interfacial film 130 may include a silicon oxide film.

As illustrated in FIG. 3, the interfacial film 130 may not be formed along the upper surface of the second field insulating film 120, but exemplary implementations are not limited thereto. Accordingly, the interfacial film 130 may be formed along the upper surface of the second field insulating film 120 depending on the method of forming the interfacial film 130.

Alternatively, even when the second field insulating film 120 includes silicon oxide, when the silicon oxide included in the second field insulating film 120 has different properties from the silicon oxide film included in the interfacial film 130, the interfacial film 130 may be formed along the upper surface of the second field insulating film 120.

The high-k dielectric film 140 may be formed between the interfacial film 130 and the gate electrode 200. It may be formed along the profile of the first to the third fin-type patterns F1-F3 protruding upward farther than the upper surface of the second field insulating film 120. Further, the high-k dielectric film 140 may be formed between the gate electrode 200 and the second field insulating film 120.

For example, the high-k dielectric film 140 may include one or more of silicon oxynitride, silicon nitride, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, but is not limited thereto.

A gate spacer 160 may be disposed on a sidewall of the gate electrode 200 extending in the second direction Y1. The gate spacer 160 may include, for example, at least one of silicon nitride (SiN), silicon oxynitride (SiON), silicon oxide (SiO$_2$), silicon oxycarbonitride (SiOCN), and a combination thereof.

The source/drain 115 may be formed on opposite sides of the gate electrode 200 in the first direction X1, and on the first fin-type pattern F1.

For example, the source/drain 115 may be formed on the second portion F1-2 of the first fin-type pattern F1.

The source/drain 115 may include an epitaxial layer formed by epitaxy. For example, the source/drain 115 may be an elevated source/drain. The epitaxial layer may fill a recess F1r formed in the second portion F1-2 of the first fin-type pattern F1.

An outer circumference of the source/drain 115 may take on a variety of shapes. For example, the outer circumference of the source/drain 115 may be at least one of diamond, circle and rectangle shapes. FIG. 5 illustrates a pentagon shape, but other shapes can also be used, for example, diamond or hexagon shapes.

When the semiconductor device according to an exemplary implementation is a PMOS transistor, the source/drain 115 may include a compressive stress material. For example, the compressive stress material may be a material such as SiGe which has a higher lattice constant compared to Si. The use of a compressive stress material can enhance mobility of the carrier in the channel region by exerting compressive stress on the first fin-type pattern F1.

When the semiconductor device according to an exemplary implementation is an NMOS transistor, the source/drain 115 may include a tensile stress material. For example, when the first fin-type pattern F1 is silicon, the source/drain 115 may be a material such as SiC which has a smaller lattice constant than the silicon. The use of tensile stress material can enhance mobility of the carrier in the channel region by exerting tensile stress on the first fin-type pattern F1.

The interlayer insulating film 190 may cover the first to the third fin-type patterns F1-F3, the source/drain 115, the gate electrode 200, and so on. The interlayer insulating film 190 may be formed on the second field insulating film 120.

For example, the interlayer insulating film 190 may include at least one of silicon oxide, silicon nitride, silicon oxynitride, and a low-k dielectric material with a smaller dielectric constant than silicon oxide. For example, the low-k dielectric material may include flowable oxide (FOX), Tonen silazen (TOSZ), undoped silica glass (USG), borosilica glass (BSG), phosphosilica glass (PSG), borophosphosilica glass (BPSG), plasma enhanced tetraethyl orthosilicate (PETEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SiLK, polyimide, porous polymeric material, or a combination thereof, but is not limited thereto.

Referring to FIG. 3, a second shallow trench ST2 may be formed between the first fin-type pattern F1 and the second fin-type pattern F2, and a third shallow trench ST3 may be formed between the second fin-type pattern F2 and the third fin-type pattern F3. The first fin-type pattern F1 may be formed between the first shallow trench ST1 and the second shallow trench ST2, and the second fin-type pattern F2 may be formed between the second shallow trench ST2 and the third shallow trench ST3. The third fin-type pattern F3 may be formed between the third shallow trench ST3 and the fourth shallow trench ST4.

The first to the fourth shallow trenches ST1-ST4 are filled with the first field insulating film 110 and the second field insulating film 120. Specifically, the first field insulating film 110 may be formed at lower portions of the first to the fourth shallow trenches ST1-ST4 and the second field insulating film 120 may be formed on the first field insulating film 110.

The second field insulating film 120 may not entirely fill the first to the fourth shallow trenches ST1-ST4, thus partially exposing the side surfaces of the first to the third fin-type patterns F1-F3.

The width WT1 of the lower portions of the first to the fourth shallow trenches ST1-ST4 may be smaller than the width WT2 of the upper portions of the first to the fourth shallow trenches ST1-ST4. First stepped portions S1 may be formed at boundaries between the upper portions and the lower portions of the first to the fourth shallow trenches ST1-ST4. This will be described below.

The first field insulating film 110 may fill the lower portions of the first to the fourth shallow trenches ST1-ST4, while having an upper surface in a bowl-like shape. That is, it is so shaped with a lower center and higher perimeter. Accordingly, the height of the upper surface of the first field insulating film 110 may be equal to or lower than the height of the contacting points with the first to the third fin-type patterns F1-F3.

The first shallow trench ST1 may contact the first fin-type pattern F1, and may also contact the deep trench DT. The bottom surface of the first shallow trench ST1 may be connected with the bottom surface of the deep trench DT. The bottom surface of the deep trench DT may be lower than the bottom surfaces of the first to the fourth shallow trenches ST1-ST4. The deep trench DT, while being connected with the first shallow trench ST1, may be filled with the first field insulating film 110 and the second field insulating film 120.

As shown in FIG. 4, the first to the third fin-type patterns F1-F3 may include a lower portion F1L, an upper portion F1U, and a first stepped portion S1. For convenience of explanation, the first fin-type pattern F1 illustrated in FIG. 4 will be exemplified. The second fin-type pattern F2 and the third fin-type pattern F3 in FIG. 3 are in identical shape as that of the first fin-type pattern F1.

Specifically, the first fin-type pattern F1 may be divided into a lower portion F1L and an upper portion F11.7 by the first stepped portion S1. That is, the lower portion F1L of the first fin-type pattern F1 may be defined to be the portion that protrudes from the substrate 100 up to the first stepped portion S1 of the first fin-type pattern F1. Likewise, the upper portion F1U of the first fin-type pattern F1 may be defined to be the portion spanning from the first stepped portion S1 to the uppermost portion of the first fin-type pattern F1. The width W1 of the lower portion F1L of the first fin-type pattern F1 may be greater than the widths W2, W3 of the upper portion F1U of the first fin-type pattern F1.

The expression "stepped portion" as used herein refers to a point or area at which a decreasing slope of the surface turns into an increasing slope, or a point or area at which an increasing slope of the surface turns into a decreasing slope. That is, the "stepped portion" as used herein may refer to a point of inflection of the profile of the surface. In other words, the "stepped portion" as used herein may refer to a point or area at which the profile of the surface turns from concave downwards into concave upwards, or a point or area at which the profile of the surface turns from the concave upwards into concave downwards. That is, the "stepped portion" refers to a point or area at which the slope of the profile is changed. In viewing the change of the slope of the profile with respect to the horizontal direction (e.g., left to right or right to left in FIG. 4), surfaces of the "stepped portion" may be identified by points where the change of the slope of the profile changes from positive to negative or negative to positive (referred to herein as the sign of the gradient of the slope).

Accordingly, the first stepped portion S1 may extend about point or area at which the sign of gradient of the slope of the side surface profile of the first fin-type pattern F1 is changed. That is, the first stepped portion S1 may be a point or area at which the side surface profile of the first fin-type pattern F1 changes from concave downwards into concave upwards, or from concave upwards into concave downwards.

The lower portion F1L of the first fin-type pattern F1 may contact the first field insulating film 110. The first field insulating film 110 may surround the lower portion F1L of the first fin-type pattern F1 on opposite sides of the first fin-type pattern F1. The upper portion F1U of the first fin-type pattern F1 may contact the second field insulating film 120. The second field insulating film 120 may surround the upper portion of the first fin-type pattern F1 on opposite sides of the first fin-type pattern F1 on the first field insulating film 110.

Specifically, a portion of the upper portion F1U of the first fin-type pattern F1 may contact the second field insulating film 120. The upper portion F1U of the first fin-type pattern F1 may include a first upper portion F1U1 and a second upper portion F1U2. Specifically, the upper portion HU of the first fin-type pattern F1 may be divided into the first upper portion F1U1 and the second upper portion F1U2 by the second stepped portion S2. That is, the first upper portion F1U1 of the first fin-type pattern F1 may be defined to be the portion spanning from the first stepped portion S1 to the second stepped portion S2. Likewise, the second upper portion of the first fin-type pattern F1 may be defined to be the portion spanning from the second stepped portion S2 to the uppermost portion of the first fin-type pattern F1. The width W2 of the first upper portion F1U1 of the first fin-type pattern F1 may be greater than the width W3 of the second upper portion F1U2 of the first fin-type pattern F1.

The first upper portion F1U1 of the first fin-type pattern F1 may contact the second field insulating film 120. The second field insulating film 120 may surround the first upper portion F1U1 of the first fin-type pattern F1 on opposite sides of the first fin-type pattern F1. The second upper portion F1U2 of the first fin-type pattern F1 may not contact the second field insulating film 120. That is, the second field insulating film 120 may expose the second upper portion F1U2 of the first fin-type pattern F1.

For example, the first field insulating film 110 and the second field insulating film 120 may be oxide film, nitride film, oxynitride film or a film combining these. Alternatively, the first field insulating film 110 and the second field insulating film 120 may include, for example, at least one of silicon oxide, silicon nitride, silicon oxynitride, and a low-k dielectric material with a smaller dielectric constant than silicon oxide. For example, the low-k dielectric material may include flowable oxide (FOX), Tonen silazen (TOSZ), undoped silica glass (USG), borosilica glass (BSG), phosphosilica glass (PSG), borophosphosilica glass (BPSG), plasma enhanced tetraethyl orthosilicate (PETEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SiLK, polyimide, porous polymeric material, or a combination thereof, but is not limited thereto.

The material of the first field insulating film 110 may be same as the material of the second field insulating film 120. For example, the first field insulating film 110 and the second field insulating film 120 may include $SiO_2$. However, exemplary implementations are not limited to the specific examples provided above. Accordingly, the material of the first field insulating film 110 and the material of the second field insulating film 120 may be different from each other.

The first field insulating film 110 and the second field insulating film 120 may have different stress characteristics. That is, the first field insulating film 110 may have the tensile stress characteristic, while the second field insulating film 120 may have the compressive stress characteristic. On the contrary, the first field insulating film 110 may have the compressive stress, while the second field insulating film 120 may have the tensile stress characteristic.

The stress characteristics of the first field insulating film 110 and the second field insulating film 120 may be determined according to the bonding energy (or binding energy) of the materials of the first field insulating film 110 and the second field insulating film 120. That is, a material in a state of low bonding energy may greatly shrink in size as the bonding energy increases by the heat treatment, i.e. it may have a relatively higher shrink rate. On the contrary, a material in a state of high bonding energy may have a relatively lower shrink rate even when undergoing a heat treatment process. Accordingly, the material with a relatively higher shrink rate may have the tensile stress characteristic, while the material with a relatively lower shrink rate may have the compressive stress characteristic.

The materials with different stress characteristics may have different etch rates from each other. Accordingly, the materials may have different etch characteristics during the etching process. The expression "same materials" as used herein refers to materials of same composition. However, even the "same materials" may have varying stress characteristics or etching characteristics depending on the bonding energy or shrink rates as described above.

The first field insulating film 110 and the second field insulating film 120 according to some exemplary implementations may include the "same materials" having the same composition, but may have different stress characteristics. Alternatively, the first field insulating film 110 and the second field insulating film 120 may have different etching characteristics, i.e., different etch rates from each other.

After being deposited to cover both the side surface and the upper surface of the first fin-type pattern F1, the first field insulating film 110 may be partially removed by the recess process. At this time, as the first field insulating film 110 is partially removed, the surface of the first fin-type pattern F1 may be partially removed. As a result, the first stepped portion S1 of the first fin-type pattern F1 may be formed. After the first field insulating film 110 is partially removed, the second field insulating film 120 may be formed on the first field insulating film 110. Accordingly, the first stepped portion S1 may be formed at a point where the boundary between the first field insulating film 110 and the second field insulating film 120 meets the first fin-type pattern F1. Then, the lower portion F1L and the upper portion F1U of the first fin-type pattern F1 may be distinguished from each other by the first stepped portion S1.

After being deposited to cover both the side surface and the upper surface of the first fin-type pattern F1 on the first field insulating film 110, the second field insulating film 120 may be partially removed by the process of exposing the first fin-type pattern F1. At this time, as the first field insulating film 110 is partially removed, the surface of the first fin-type pattern F1 may be partially removed. As a result, the second stepped portion S2 of the first fin-type pattern F1 may be formed. Further, after the process of exposing the first fin-type pattern F1, the width of the exposed portion of the first fin-type pattern F1 may be further decreased by the process of smoothening the shape of the exposed portion of the first fin-type pattern F1. Accordingly, the portion surrounded by the second field insulating film 120 (i.e., first upper portion F1U1) and the exposed portion (i.e., second upper portion F1U2) may be distinguished from each other by the second stepped portion S2.

The first fin-type pattern F1 may be formed on the first active region ACT1, and the first active region ACT1 may be defined by the deep trench DT. At this time, the deep trench DT may be connected with the first shallow trench ST1 located on one side surface of the first fin-type pattern F1. A third stepped portion S3 may be formed between the deep trench DT and the first shallow trench ST1.

In the semiconductor device according to some exemplary implementation, the first field insulating film 110 and the second field insulating film 120 may have different stress characteristics as described above. Accordingly, the locations of the first to the third fin-type patterns F1-F3 contacting the first field insulating film 110 and the second field insulating film 120 may be adjusted.

Specifically, when the field insulating film formed with only one stress characteristic is used, the fin-type pattern in the neighborhood may bend according to the volume of the field insulating film. Accordingly, the occurrence of unintended bend in the fin-type pattern may cause reduced margins between the fin-type patterns, and may afterward increase the possibility of mis-alignment in the electric wiring structure such as when a contact point also increases. Accordingly, to prevent the above, the field insulating film may be so configured as to include the first field insulating film 110 and the second field insulating film 120 having different stress characteristics from each other.

Figure 6:
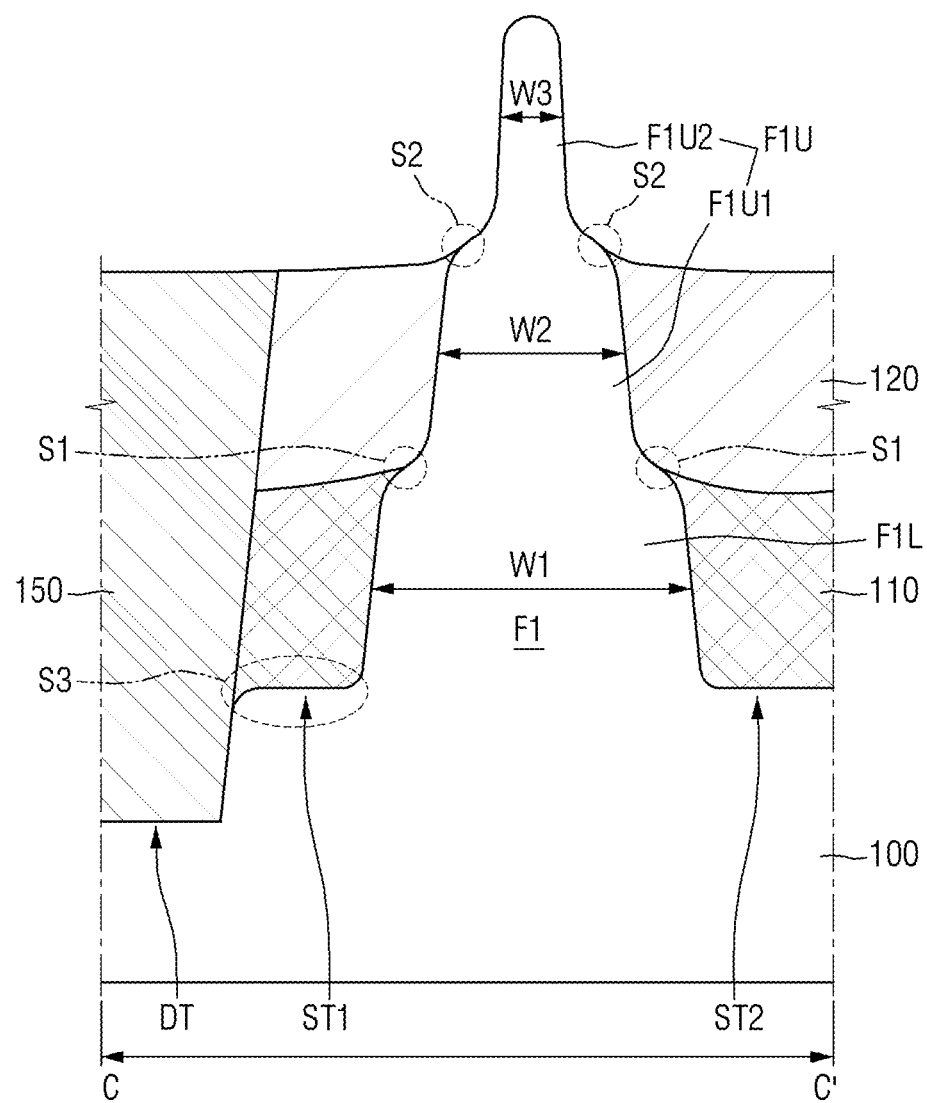
FIG. 6 is a cross sectional view provided to explain a semiconductor device according to another exemplary implementation.

Hereinbelow, a semiconductor device will be described with reference to FIG. 6 which is a cross sectional view provided to explain the semiconductor device according to another exemplary implementation. Meanwhile, elements or operations overlapping with those described above with reference to FIGS. 1 to 5 will be mentioned as briefly as possible or omitted for the sake of brevity.

Unlike the exemplary implementation described with reference to FIGS. 1 to 5, the exemplary implementation illustrated in FIG. 6 may have a third field insulating film 150 formed in the deep trench DT. That is, while the exemplary implementation described with reference to FIGS. 1 to 5 exemplifies that the first field insulating film 110 and the second field insulating film 120 are formed in the deep trench DT continuously to the first shallow trench ST1, the semiconductor device of FIG. 6 may have the third field insulating film 150 in the deep trench DT.

The deep trench DT may be formed after the first field insulating film 110 and the second field insulating film 120 are formed. Accordingly, the deep trench DT may be formed by partially removing the first field insulating film 110, the second field insulating film 120 and the substrate 100. In this case, the sidewalls of the deep trench DT may be the substrate 100, the first field insulating film 110 and the second field insulating film 120.

The third field insulating film 150 may fill the deep trench DT. The third field insulating film 150 may include the same material as the first field insulating film 110 or the second field insulating film 120. For example, the third field insulating film 150 may include at least one of silicon oxide, silicon nitride, silicon oxynitride, and a low-k dielectric material with a smaller dielectric constant than silicon oxide.

Hereinbelow, a semiconductor device according to yet another exemplary implementation will be described with reference to FIGS. 7 and 8. Elements or operations overlapping with those described above with reference to FIGS. 1 to 6 will be mentioned as briefly as possible or omitted for the sake of brevity.

Figure 7:
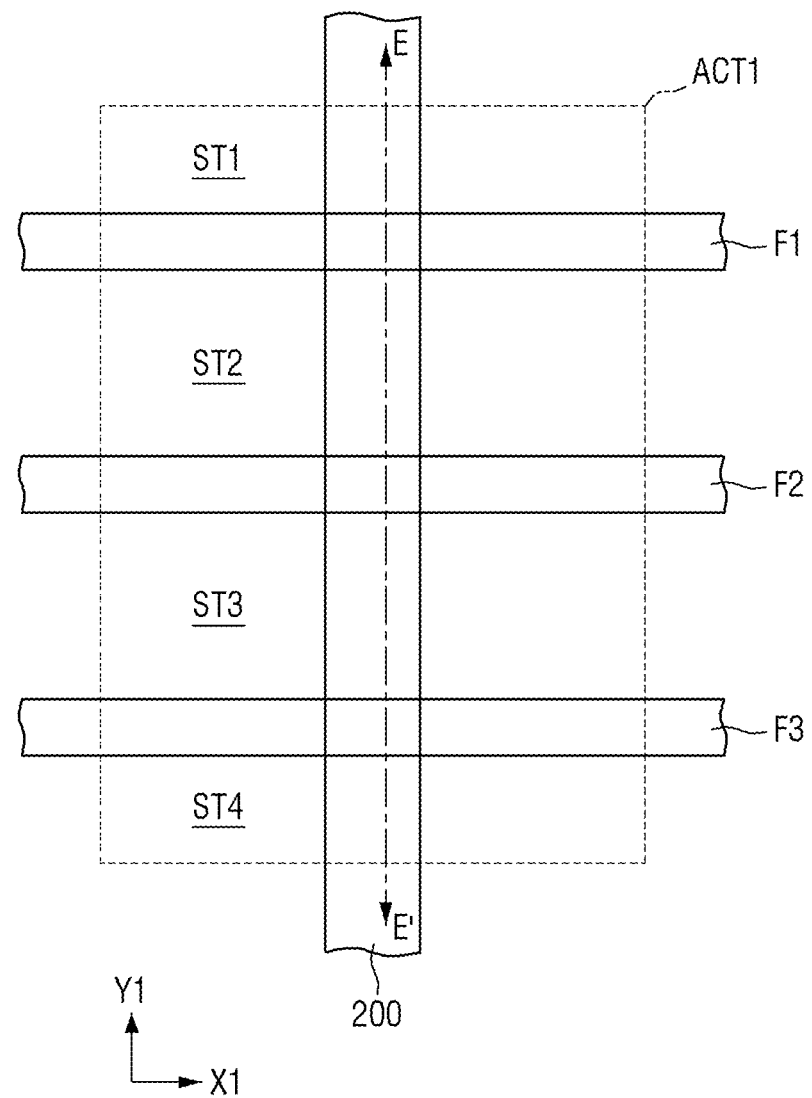
FIG. 7 is a layout diagram provided to explain a semiconductor device according to yet another exemplary implementation.
Figure 8:
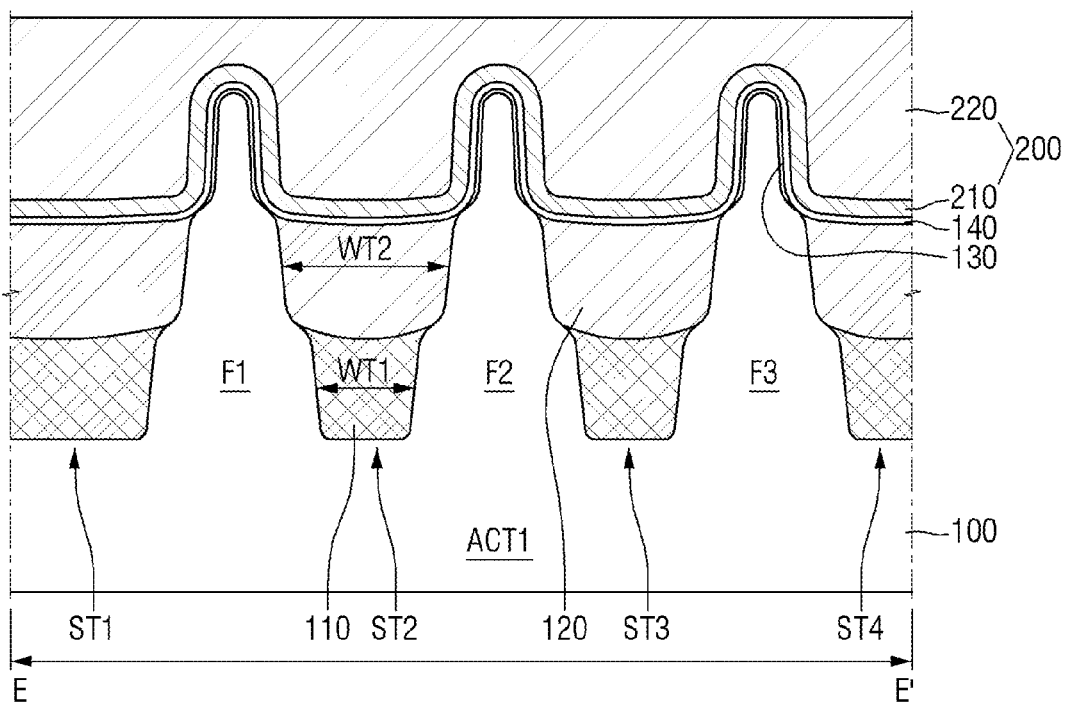
FIG. 8 is a cross sectional view taken on line E-E' of FIG. 7.

FIG. 7 is a layout diagram provided to explain a semiconductor device according to yet another exemplary implementation, and FIG. 8 is a cross sectional view taken on line E-E' of FIG. 7.

Unlike the exemplary implementation described with reference to FIGS. 1 to 5, the exemplary implementation illustrated in FIGS. 7 and 8 may not have the deep trench DT connected with the first shallow trench ST1. That is, the first fin-type pattern F1 may include the first stepped portion S1 and the second stepped portion S2, but may not include the third stepped portion S3 of FIG. 4.

As shown in FIGS. 7 and 8, all of the first to the third fin-type patterns F1-F3 may be in the identical shape. All of the first to the third fin-type patterns F1-F3 of FIGS. 1 to 3 may include the first stepped portion S1 and the second stepped portion S2.

The first to the fourth shallow trenches ST1-ST4 may be formed on opposite side surfaces of the first to the third fin-type patterns F1-F3. The first to the fourth shallow trenches ST1-ST4 may include upper portions and lower portions. The width WT1 of the lower portions of the first to the fourth shallow trenches ST1-ST4 may be smaller than the width WT2 of the upper portions of the first to the fourth shallow trenches ST1-ST4. First stepped portions S1 may be formed at boundaries between the upper portions and the lower portions of the first to the fourth shallow trenches ST1-ST4.

The bottom surfaces of the first to the fourth shallow trenches ST1-ST4 may have an identical height as each other. The expression "identical" as used herein conveys the meaning of forming by the same process, and also refers to the concept that includes presence of minute stepped portions.

Hereinbelow, a semiconductor device according to yet another exemplary implementation will be described with reference to FIGS. 9 to 11. Elements or operations overlapping with those described above with reference to FIGS. 1 to 8 will be mentioned as briefly as possible or omitted for the sake of brevity.

Figure 9:
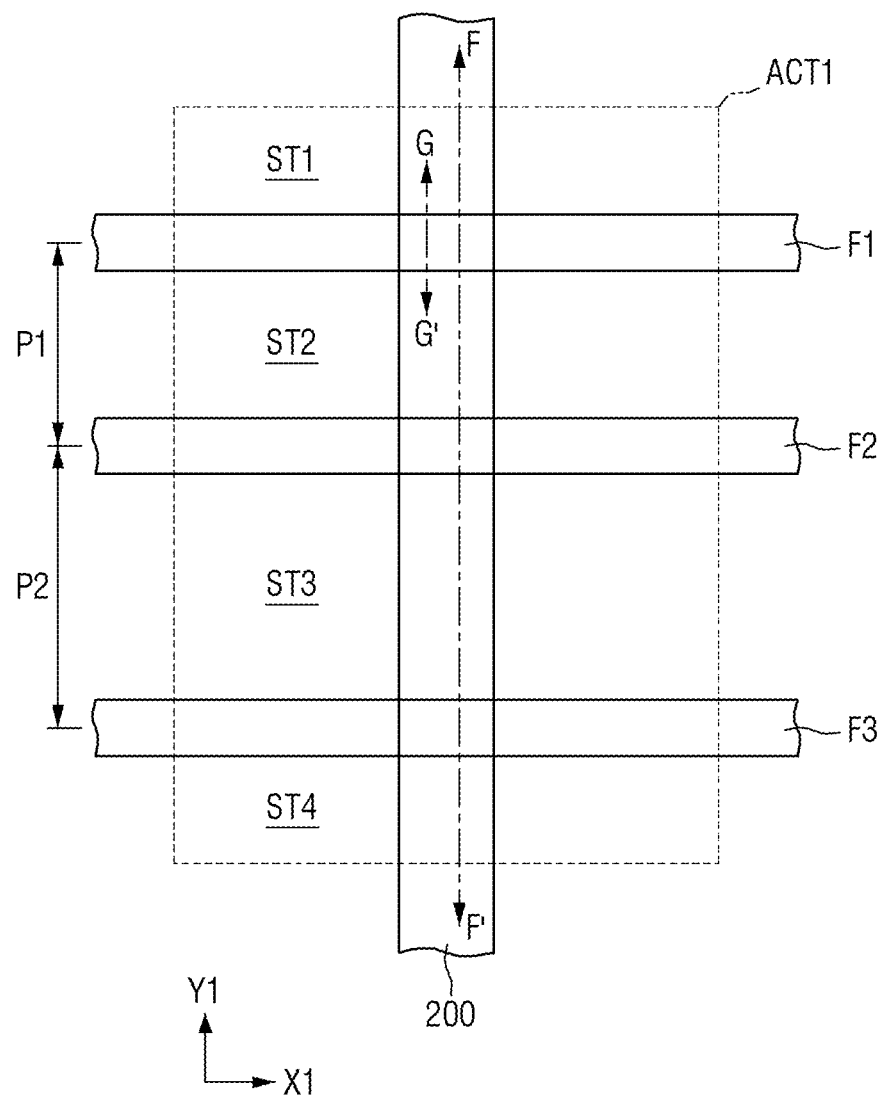
FIG. 9 is a layout diagram provided to explain a semiconductor device according to yet another exemplary implementation.
Figure 10:
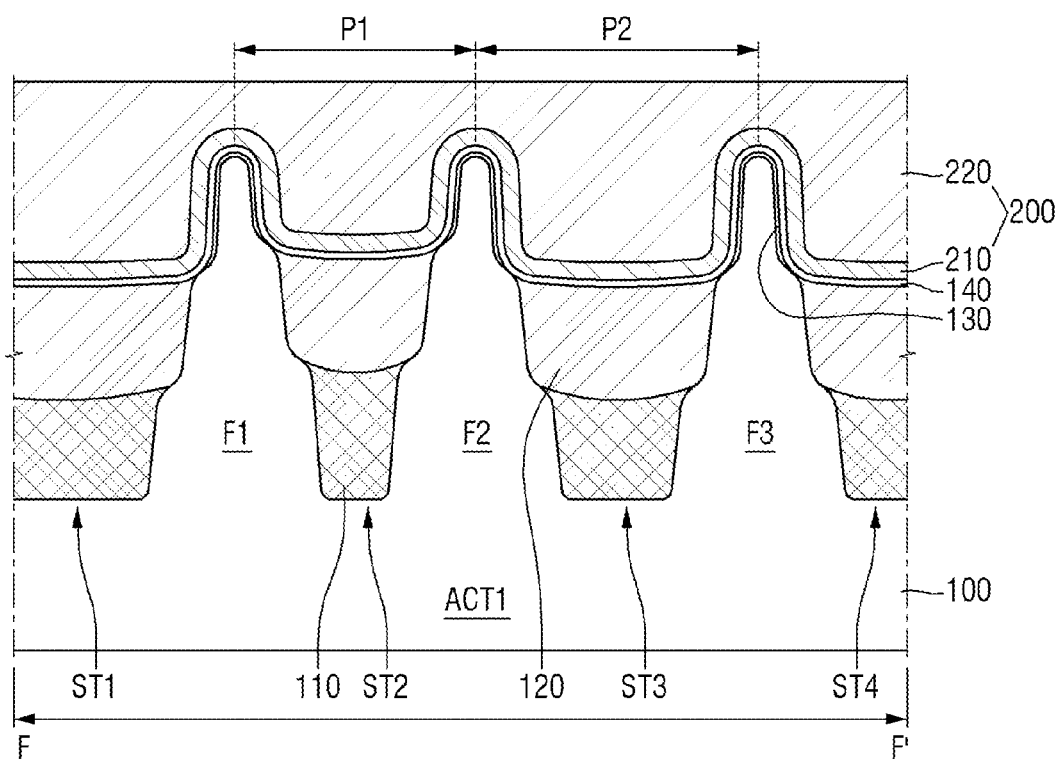
FIG. 10 is a cross sectional view taken on line F-F' of FIG. 9.

FIG. 9 is a layout diagram provided to explain a semiconductor device according to yet another exemplary implementation, and FIG. 10 is a cross sectional view taken on line F-F' of FIG. 9. FIG. 11 is a cross sectional view taken on line G-G' of FIG. 9.

Unlike the exemplary implementation described with reference to FIGS. 1 to 5, the first pitch P1 between the first fin-type pattern F1 and the second fin-type pattern F2, and the second pitch P2 between the second fin-type pattern F2 and the third fin-type pattern F3 may be different from each other. Accordingly, the width in the second direction Y1 of the second shallow trench ST2, and the width in the second direction Y1 of the third shallow trench ST3 may be different from each other.

Figure 11:
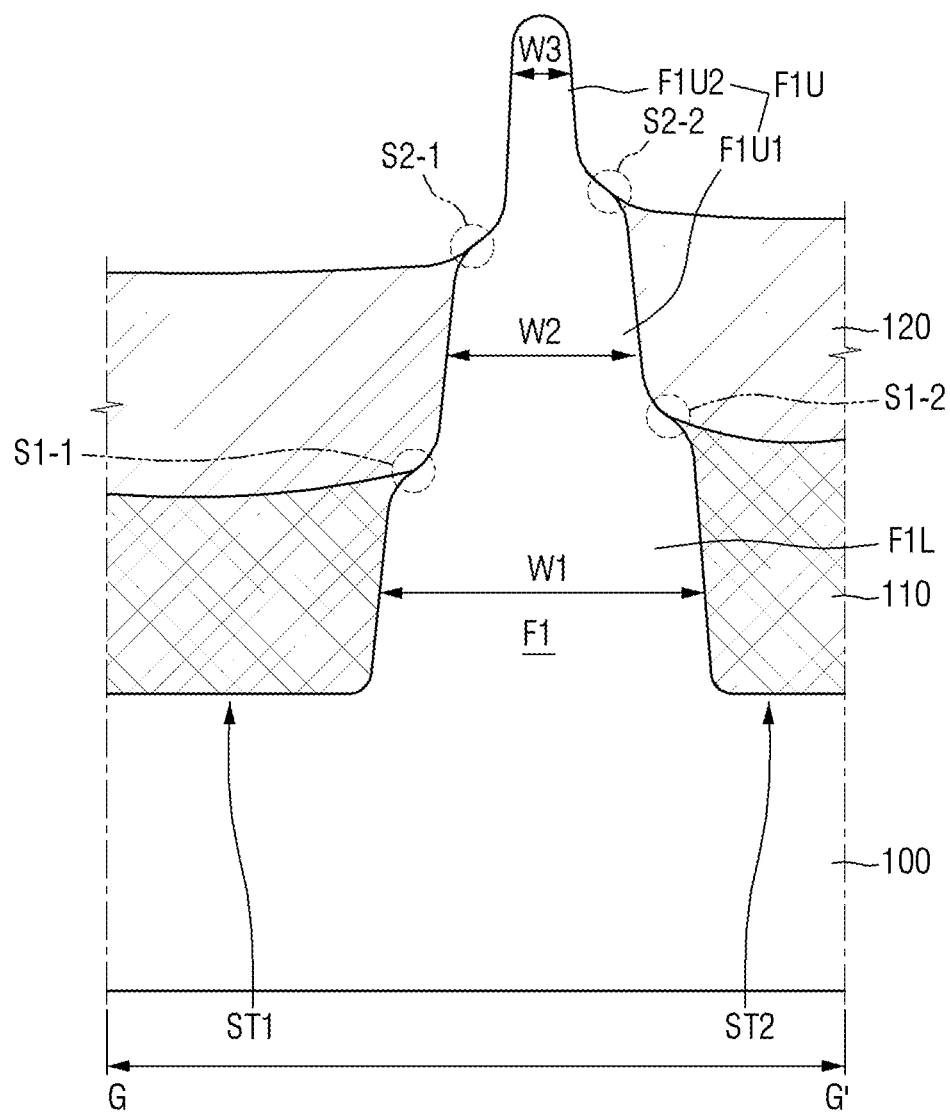
FIG. 11 is a cross sectional view taken on line G-G' of FIG. 9.

As shown in FIGS. 10 and 11, the locations of the first stepped portion and the second stepped portion of the first fin-type pattern F1 and the second fin-type pattern F2 may be different from each other on opposite side surfaces. For convenience of explanation, the first fin-type pattern F1 will be described with reference to FIG. 11.

The first fin-type pattern F1 may include a first side surface and a second side surface. The first side surface may be the side surface that contacts the first shallow trench ST1, and the second side surface may be the side surface that contacts the second shallow trench ST2. The width of the second shallow trench ST2 at the second side surface may be smaller than the width of the other shallow trench.

The first stepped portion S1-2 at the second side surface of the first fin-type pattern F1 may be positioned higher than the first stepped portion S1-1 at the first side surface. During partial removal of the first field insulating film 110, due to the narrow pitch between the first fin-type pattern F1 and the second fin-type pattern F2, the first field insulating film 110 in the second shallow trench ST2 may be removed relatively less than the other regions. As such, the first stepped portion S1-2 at the second side surface within the second shallow trench ST2 may be located higher than the first stepped portion S1-1 at the first side surface within the first shallow trench ST1. Accordingly, the upper surface of the first field insulating film 110 in the second shallow trench ST2 may be formed higher than the upper surface of the first field insulating film 110 in the first shallow trench ST1.

The second stepped portion S2-2 at the second side surface of the first fin-type pattern F1 may be positioned higher than the second stepped portion S2-1 at the first side surface. During partial removal of the second field insulating film 120, due to the narrow pitch between the first fin-type pattern F1 and the second fin-type pattern F2, the second field insulating film 120 in the second shallow trench ST2 may be removed relatively less than the other regions. As such, the second stepped portion S2-2 at the second side surface within the second shallow trench ST2 may be located higher than the second stepped portion S2-1 at the first side surface within the first shallow trench ST1. Accordingly, the upper surface of the second field insulating film 120 in the second shallow trench ST2 may be formed higher than the upper surface of the second field insulating film 120 in the first shallow trench ST1.

As shown in FIG. 10, likewise, the second fin-type pattern F2 may have the first and the second stepped portions at different heights at the opposite side surfaces. In this case, as illustrated in FIG. 10, the first and the second stepped portions at the first side surface of the second fin-type pattern F2 contacting the second shallow trench ST2, may be located higher than the first and the second stepped portions at the second side surface of the second fin-type pattern F2 contacting the third shallow trench ST3.

Hereinbelow, a semiconductor device according to yet another exemplary implementation will be described with reference to FIG. 12. Elements or operations overlapping with those described above with reference to FIGS. 1 to 11 will be mentioned as briefly as possible or omitted for the sake of brevity.

Figure 12:
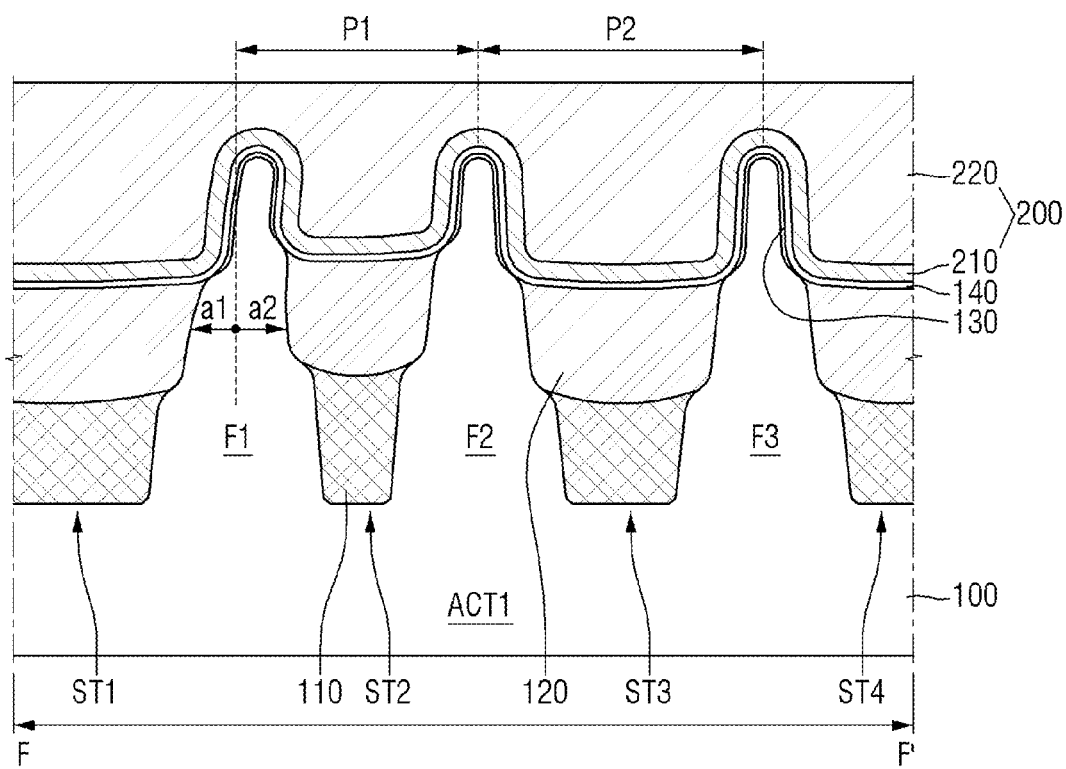
FIG. 12 is a cross sectional view provided to explain a semiconductor device according to yet another exemplary implementation.

FIG. 12 is a cross sectional view provided to explain a semiconductor device according to yet another exemplary implementation.

As shown in FIG. 12, the first fin-type pattern F1 may be inclined toward the second fin-type pattern F2. The first fin-type pattern F1 may be formed such that the width a1 from the center line of the first fin-type pattern F1 to the first side surface closer to the first shallow trench ST1 is smaller than the width a2 from the center line to the second side surface closer to the second shallow trench ST2. The center line may be the center line of the width of the first fin-type pattern F1 on a contact surface between the first fin-type pattern F1 and the substrate 100. That is, the first to the third fin-type patterns F1-F3 may be inclined as the volumes of the first field insulating film 110 and the second field insulating film 120 vary in the first to the fourth shallow trenches ST1-ST4, respectively.

For example, when the first field insulating film 110 has the tensile stress characteristic and the second field insulating film 120 has the compressive stress characteristic, according to the locations of the first and the second stepped portions, the first field insulating film 110 and the second field insulating film 120 of the first to the fourth shallow trenches ST1-ST4 have different volumes. If, by the first and the second stepped portions, the difference between the compressive stress of the second field insulating film 120 of the first shallow trench ST1 and the compressive stress of the second field insulating film 120 of the second shallow trench ST2 is greater than the difference between the tensile stress of the first field insulating film 110 of the first shallow trench ST1 and the tensile stress of the first field insulating film 110 of the second shallow trench, the first fin-type pattern F1 may be inclined toward the second fin-type pattern F2, as illustrated.

As described above, the direction where the first fin-type pattern F1 is inclined and degree of such inclination may be adjusted by adjusting the ratio of volumes of the first field insulating film 110 and the second field insulating film 120 within the first to the fourth shallow trenches ST1-ST4, respectively.

Hereinbelow, a semiconductor device according to yet another exemplary implementation will be described with reference to FIGS. 1 and 13. Elements or operations overlapping with those described above with reference to FIGS. 1 to 12 will be mentioned as briefly as possible or omitted for the sake of brevity.

Figure 13:
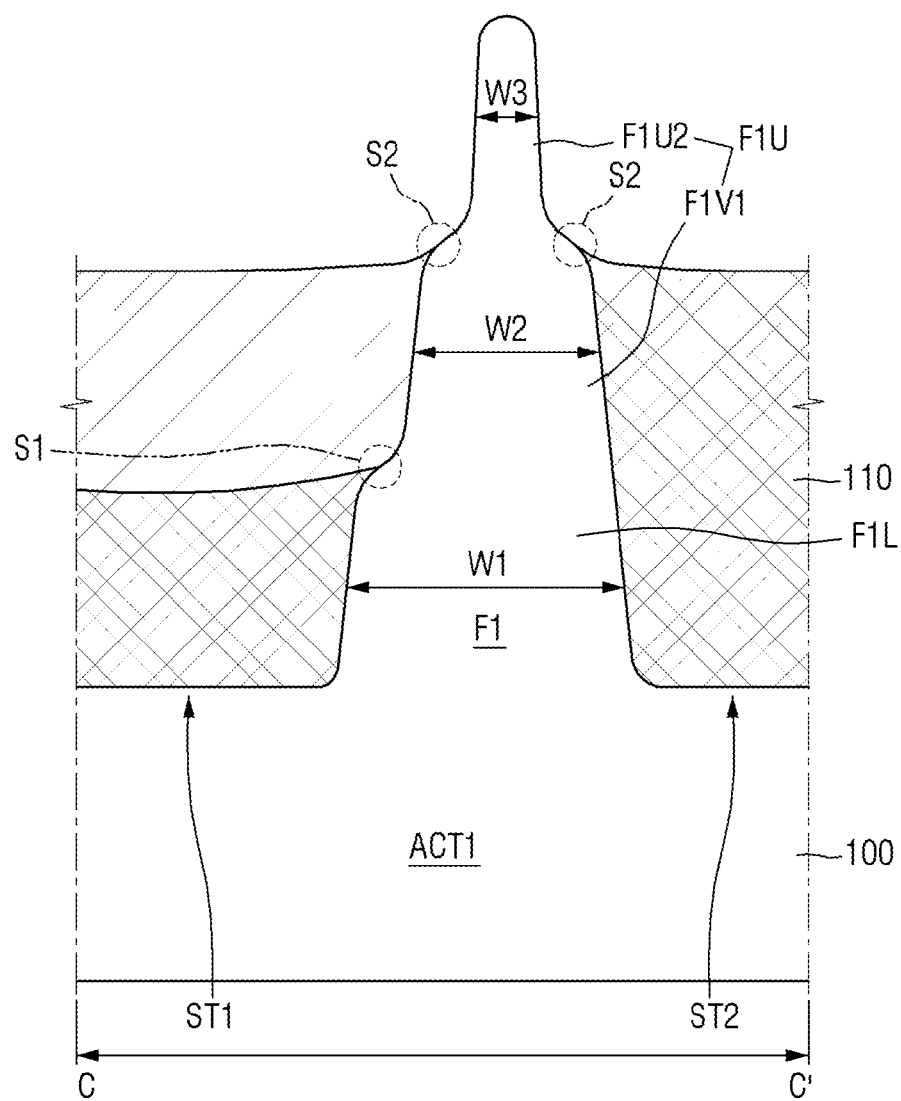
FIG. 13 is a cross sectional view provided to explain a semiconductor device according to yet another exemplary implementation.

FIG. 13 is a cross sectional view provided to explain a semiconductor device according to yet another exemplary implementation.

As shown in FIGS. 1 and 13, for the first fin-type pattern F1, both the first field insulating film 110 and the second field insulating film 120 may fill the first shallow trench ST1, but the second field insulating film 120 may not be formed in the second shallow trench ST2 and only the first field insulating film 110 may fill the second shallow trench ST2.

In this case, the first stepped portion at the second shallow trench ST2 may overlap with the second stepped portion S2. That is, only one stepped portion may be formed at the second side surface of the first fin-type pattern F1 closer to the second shallow trench ST2, while there may be two stepped portions formed at the first side surface of the first fin-type pattern F1 closer to the first shallow trench ST1.

At this time, whether or not the first fin-type pattern F1 is inclined, and the direction and the degree of such inclination may be adjusted according to the stress characteristics of the first field insulating film 110 and the second field insulating film 120.

Hereinbelow, a semiconductor device according to yet another exemplary implementation will be described with reference to FIGS. 1 and 14. Elements or operations overlapping with those described above with reference to FIGS. 1 to 13 will be mentioned as briefly as possible or omitted for the sake of brevity.

Figure 14:
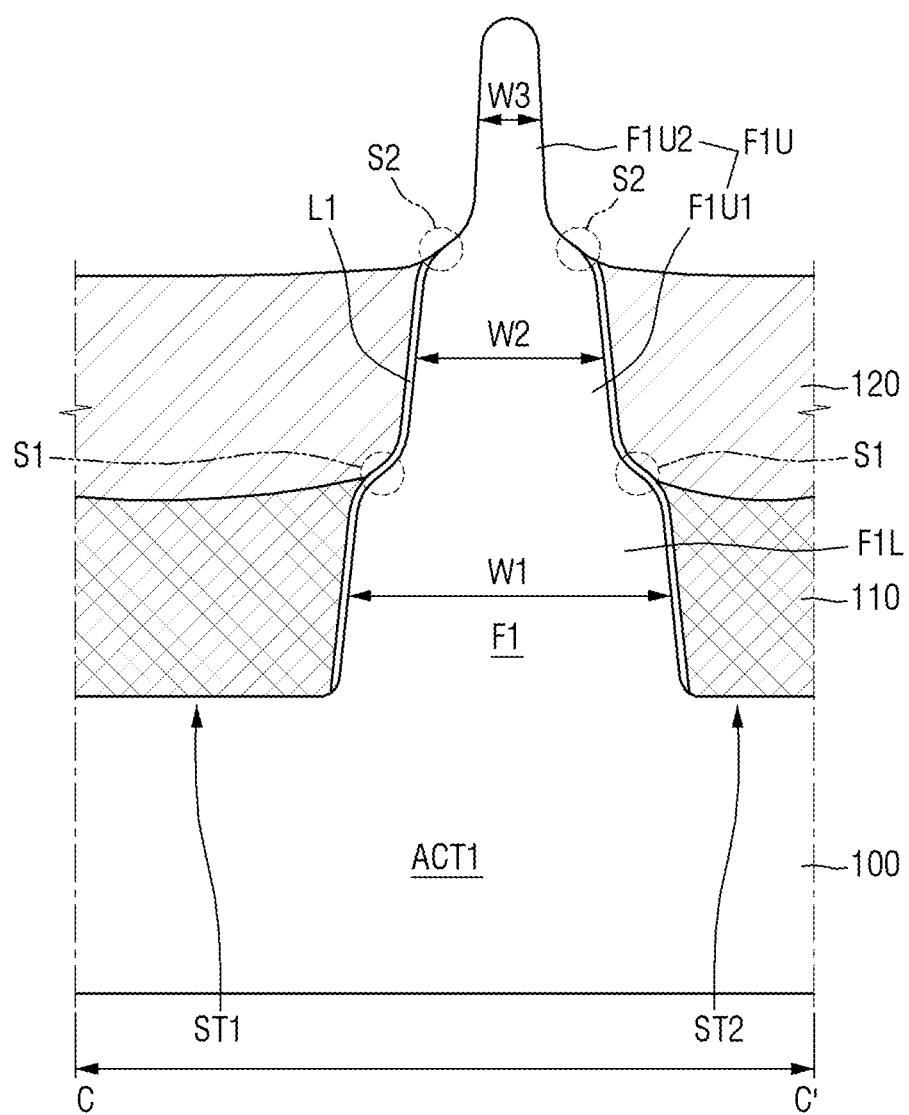
FIG. 14 is a cross sectional view provided to explain a semiconductor device according to yet another exemplary implementation.

FIG. 14 is a cross sectional view provided to explain a semiconductor device according to yet another exemplary implementation.

As shown in FIGS. 1 and 14, the semiconductor device according to yet another exemplary implementation includes a liner L1.

The liner L1 may be formed on a side surface of the first fin-type pattern F1. The liner L1 may be formed along the profile of the surface of the side surface of the first fin-type pattern F1. The liner L1 may be formed between the first fin-type pattern F1, and the first field insulating film 110 and the second field insulating film 120. That is, the liner L1 may be formed on the surfaces of the lower portion F1L and the first upper portion F1U1 of the first fin-type pattern F1, and may not be formed on the surface of the second upper portion F1U2. However, exemplary implementations are not limited to any specific example only. Accordingly, it may also be formed on the surface of the second upper portion F1U2 depending on the manufacturing process. Likewise, depending on materials and manufacturing process, the liner L1 may be formed on not only the surface of the first fin-type pattern F1, but also the upper surface of the substrate 100.

For example, the liner L1 may be a conductive film such as polysilicon, or an insulating film such as silicon oxide. In other words, the material of the liner L1 may be selected from several materials depending on process and use.

Hereinbelow, a semiconductor device according to yet another exemplary implementation will be described with reference to FIGS. 15 and 16. Elements or operations overlapping with those described above with reference to FIGS. 1 to 14 will be mentioned as briefly as possible or omitted for the sake of brevity.

Figure 15:
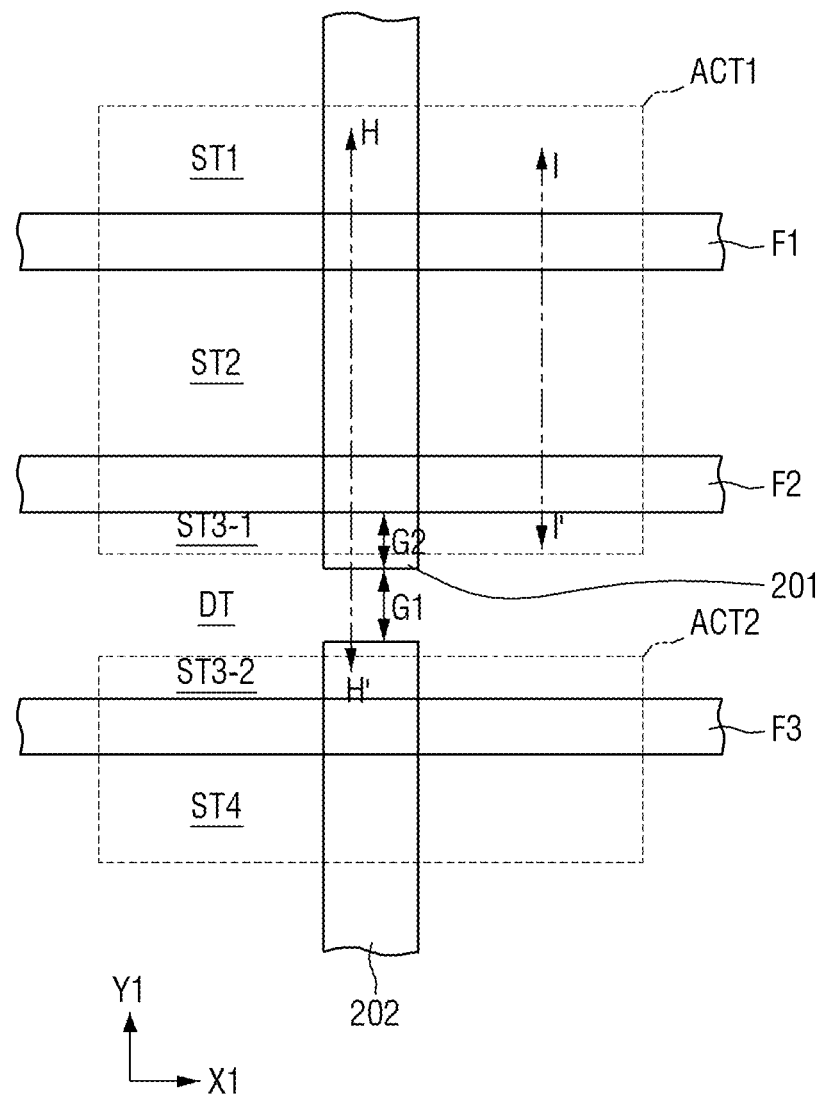
FIG. 15 is a layout diagram provided to explain a semiconductor device according to yet another exemplary implementation.
Figure 16:
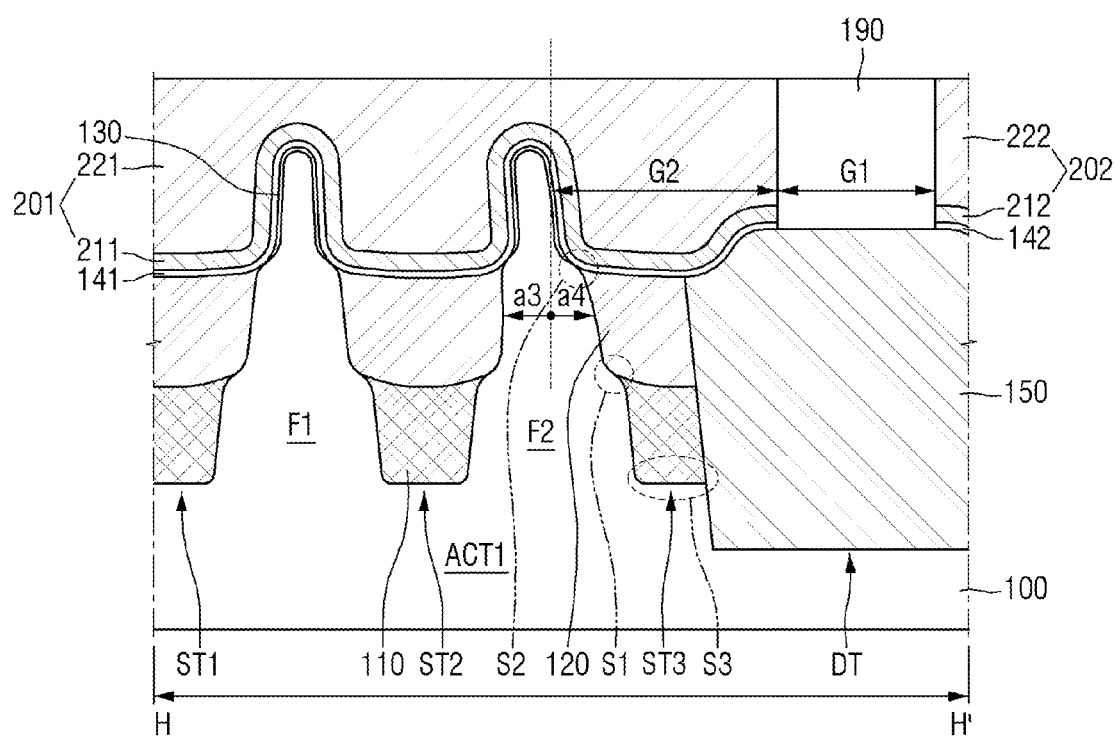
FIG. 16 is a cross sectional view taken on line H-H' of FIG. 15.

FIG. 15 is a layout diagram provided to explain a semiconductor device according to yet another exemplary implementation, and FIG. 16 is a cross sectional view taken on line H-H' of FIG. 15.

As shown in FIGS. 15 and 16, the semiconductor device according to some exemplary implementations includes a third field insulating film 150, a first gate electrode 201, first gate insulating films 130, 140, a second gate electrode 202 and a second gate insulating film 142. In the exemplary implementation of FIGS. 15 and 16, the deep trench DT may be formed in the center of the third shallow trench ST3-1, ST3-2.

The third field insulating film 150 may fill the deep trench DT. The third field insulating film 150 may contact the first field insulating film 110 and the second field insulating film 120. The third field insulating film 150 may include the same material as the first field insulating film 110 or the second field insulating film 120. For example, the third field insulating film 150 may include at least one of silicon oxide, silicon nitride, silicon oxynitride, and a low-k dielectric material with a smaller dielectric constant than silicon oxide.

The upper surface of the third field insulating film 150 may be higher than the upper surface of the second field insulating film 120. However, exemplary implementation are not limited to the specific examples provided above. Accordingly, the upper surface of the third field insulating film 150 may be lower than, or equal to the upper surface of the second field insulating film 120.

While FIG. 16 illustrates the third field insulating film 150, in a semiconductor device according to some exemplary implementations, the third field insulating film 150 may not be used and the first field insulating film 110 and the second field insulating film 120 may fill the deep trench DT.

The first gate electrode 201 may include a first metal layer 211 and a second metal layer 221. Alternatively, the first gate electrode 201 may be formed by two or more metal layers stacked on one another. The first metal layer 211 plays a role of adjusting work function, and the second metal layer 221 plays a role of filling the space formed by the first metal layer 211. For example, the first metal layer 211 may include at least one of, for example, TiN, WN, TiAl, TiAlN, TaN, TiC, TaC, TaCN, TaSiN and a combination thereof, but is not limited thereto. Further, the second metal layer 221 may include at least one of, for example, W, Al, Cu, Co, Ti, Ta, poly-Si, SiGe and a metal alloy, but is not limited thereto.

The second gate electrode 202 may include a first metal layer 212 and a second metal layer 222. Alternatively, the second gate electrode 202 may be formed by two or more metal layers are stacked on one another. The first metal layer 212 plays a role of adjusting work function, and the second metal layer 222 plays a role of filling the space formed by the first metal layer 212. For example, the first metal layer 212 may include at least one of, for example, TiN, WN, TiAl, TiAlN, TaN, TiC, TaC, TaCN, TaSiN and a combination thereof, but is not limited thereto. Further, the second metal layer 222 may include at least one of, for example, W, Al, Cu, Co, Ti, Ta, poly-Si, SiGe and a metal alloy, but is not limited thereto.

For example, the first gate electrode 201 and the second gate electrode 202 may be formed by the replacement process (or the gate last process), but is not limited thereto.

The first gate insulating films 130, 141 may be formed between the first and the second fin-type patterns F1, F2 and the first gate electrode 201, between the second field insulating film 120 and the first gate electrode 201, and between the third field insulating film 150 and the first gate electrode 201. The first gate insulating films 130, 141 may include an interfacial film 130 and a first high-k dielectric film 141.

The second gate insulating film 142 may be formed between the third fin-type pattern F3 and the second gate electrode 202, and between the third field insulating film 150 and the second gate electrode 202. The second gate insulating film 142 may include an interfacial film 130 and a second high-k dielectric film 142.

As shown in FIG. 16, the first gate electrode 201 and the second gate electrode 202 may extend in the first direction X1, respectively. The first gate electrode 201 and the second gate electrode 202 may be spaced apart from each other in the first direction X1. One end of the first gate electrode 201 and one end of the second gate electrode may be opposed to each other in the first direction X1. In this case, the first gate insulating films 130, 140 overlap with the first gate electrode 201, and the second gate insulating film 142 overlaps with the second gate electrode 202. Accordingly, the first gate insulating films 130, 140 and the second gate insulating film 142 may also be spaced apart from each other in the first direction.

An interlayer insulating film 190 may be formed between the first gate electrode 201 and the second gate electrode 202. For example, the interlayer insulating film 190 may include at least one of silicon oxide, silicon nitride, silicon oxynitride, and a low-k dielectric material with a smaller dielectric constant than silicon oxide.

The first gate electrode 201 and the second gate electrode 202 have to be isolated electrically from each other. Accordingly, the interlayer insulating film 190 may be formed between the first gate electrode 201 and the second gate electrode 202 to electrically isolate the first gate electrode 201 and the second gate electrode 202 from each other.

Further, the first gate electrode 201 and the second gate electrode 202 have to be spaced apart from each other by a predetermined gap G1 in compliance with the design rule as restricted by the manufacturing process. That is, in a semiconductor device according to some exemplary implementations, the spacing margin has to be ensured between the first gate electrode 201 and the second gate electrode 202.

Note that reducing the end of the first gate electrode 201 to the direction of the second fin-type pattern F2 to ensure the margin of the first gate electrode 201 and the second gate electrode 202 can be accompanied with the problem of non-overlapping between the second fin-type pattern F2 and the first gate electrode 201. Accordingly, a gap G2 may be contemplated for an overlapping margin between the first gate electrode 201 and the second fin-type pattern F2.

As shown in FIG. 16, the second fin-type pattern F2 may be inclined to ensure the gap G2 for the overlapping margin between the first gate electrode 201 and the second fin-type pattern F2. The second fin-type pattern F2 may be inclined to a direction farther away from one end of the first gate electrode 201. The second fin-type pattern F2 may be formed such that the width a3 from the center line of the second fin-type pattern F2 to the first side surface closer to the second shallow trench ST2 is larger than the width a4 from the center line to the second side surface closer to the third shallow trench ST3. The center line may be the center line of the width of the second fin-type pattern F2 on a contact surface between the second fin-type pattern F2 and the substrate 100.

As a result, the first gate electrode 201 can satisfy both the overlapping margin G2 with the second fin-type pattern F2 and the spacing margin with the second gate electrode 202.

Hereinbelow, a semiconductor device according to yet another exemplary implementation will be described with reference to FIGS. 15 and 17. Elements or operations overlapping with those described above with reference to FIGS. 1 to 11 will be mentioned as briefly as possible or omitted for the sake of brevity.

Figure 17:
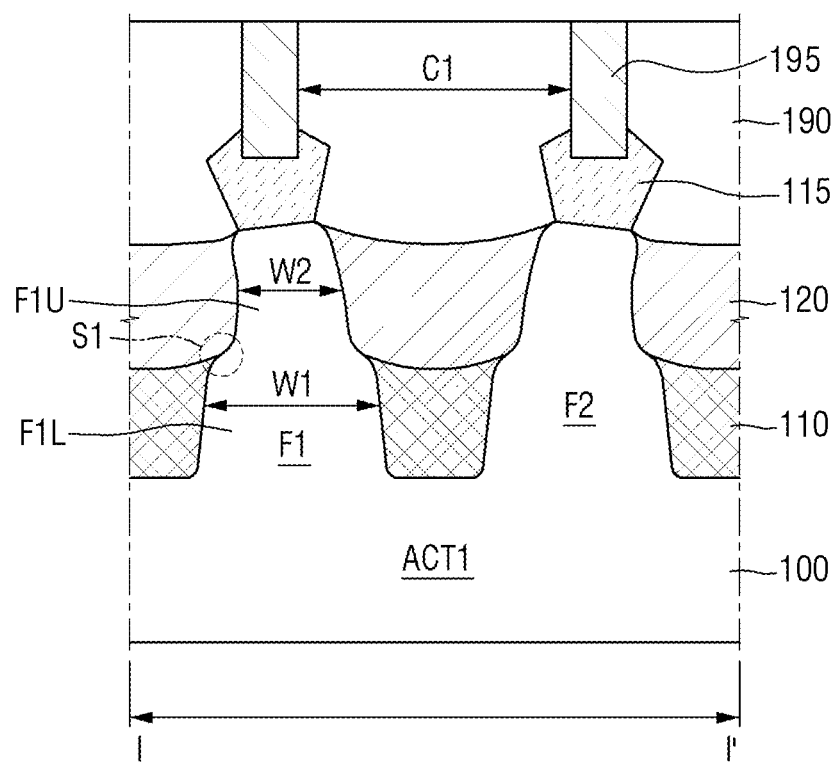
FIG. 17 is a cross sectional view taken on line I-I' of FIG. 15.

FIG. 17 is a cross sectional view taken on line I-I' of FIG. 15.

As shown in FIGS. 15 and 17, the semiconductor device according to an exemplary implementation additionally includes a contact 195.

The contact 195 may be formed on the source/drain 115. The contact 195 may be formed by passing through the interlayer insulating film 190. A lower portion of the contact 195 may be inserted into the source/drain 115. However, exemplary implementations are not limited to the example given above. The contact 195 may be electrically connected with the source/drain 115. The contact 195 may include a plurality of contacts. The source/drain 115 on the first fin-type pattern F1 and the source/drain 115 on the second fin-type pattern F2 may be connected one-to-one, respectively.

The plurality of contacts 195 should not be contacted with each other, but electrically isolated. Further, considering the gradually narrowing gaps among the plurality of contacts 195 according to miniaturization of the semiconductor device, the spacing margin has to be ensured among the plurality of contacts 195. According to an exemplary implementation, the semiconductor device can ensure an increased gap between the source/drains 115, as the adjacent fin-type patterns (i.e., the first fin-type pattern F1 and the second fin-type pattern F2) are inclined in opposite directions to each other. Further, a larger gap C1 may be ensured among the contacts 195 formed on the respective source/drains 115. Accordingly, electrical short circuits among the plurality of contacts 195 are prevented and reliability of the semiconductor device is increased.

Figure 18:
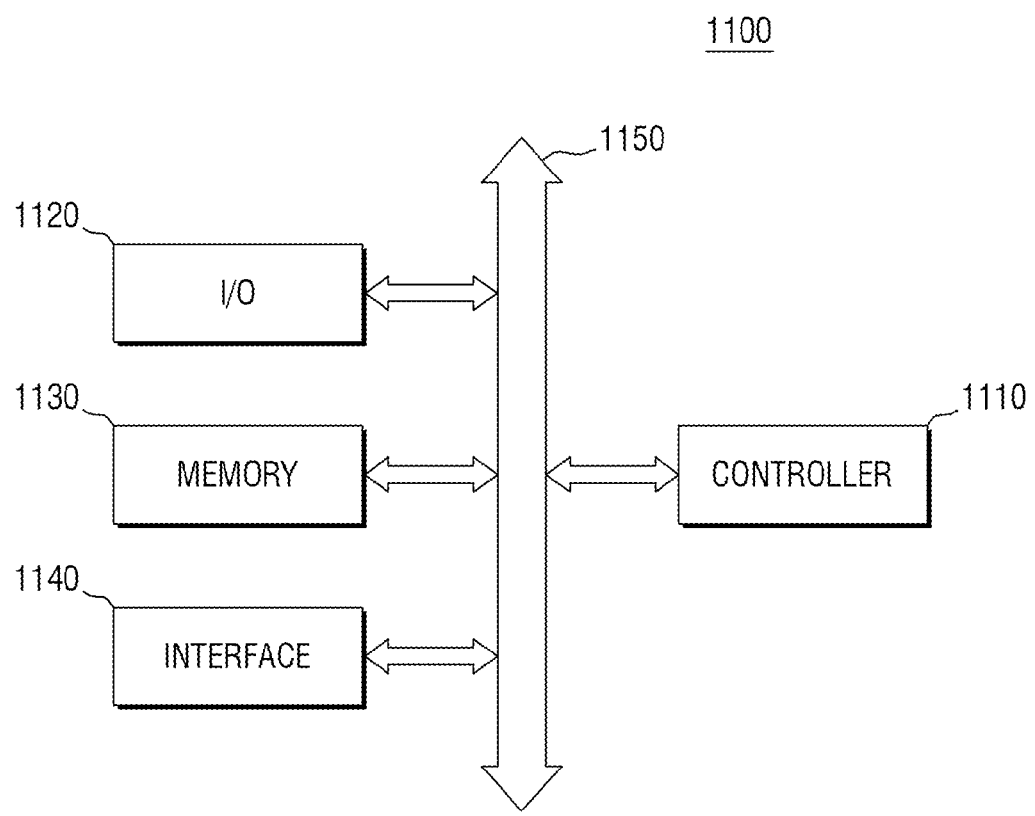
FIG. 18 is a block diagram of an electronic system comprising a semiconductor device according to some exemplary implementations.

FIG. 18 is a block diagram of an electronic system comprising a semiconductor device according to exemplary implementations.

As shown in FIG. 18, the electronic system 1100 may include a controller 1110, an input/output (I/O) device 1120, a memory device 1130, an interface 1140 and a bus 1150. The controller 1110, the I/O device 1120, the memory device 1130 and/or the interface 1140 may be coupled with one another via the bus 1150. The bus 1150 corresponds to a path through which data travels.

The controller 1110 may include at least one of a microprocessor, a digital signal processor, a micro controller and logic devices capable of performing functions similar to the other devices listed. The I/O device 1120 may include a keypad, a keyboard, a display device and so on. The memory device 1130 may store data and/or commands. The interface 1140 may perform a function of transmitting or receiving data to or from communication networks. The interface 1140 may be wired or wireless. For example, the interface 1140 may include an antenna or a wired/wireless transceiver.

Although not illustrated, the electronic system 1100 may additionally include an operation memory configured to enhance operation of the controller 1110, such as a high-speed dynamic random-access memory (DRAM) and/or a static random access memory (SRAM).

According to the exemplary implementations described above, the semiconductor device may be provided within the memory device 1130, or provided as a part of the controller 1110 or the I/O device 1120.

The electronic system 1100 is applicable to a personal digital assistant (PDA) portable computer, a web tablet, a wireless phone, a mobile phone, a digital music player, a memory card, or almost all electronic products that are capable of transmitting and/or receiving data in wireless environment.

Figure 19:
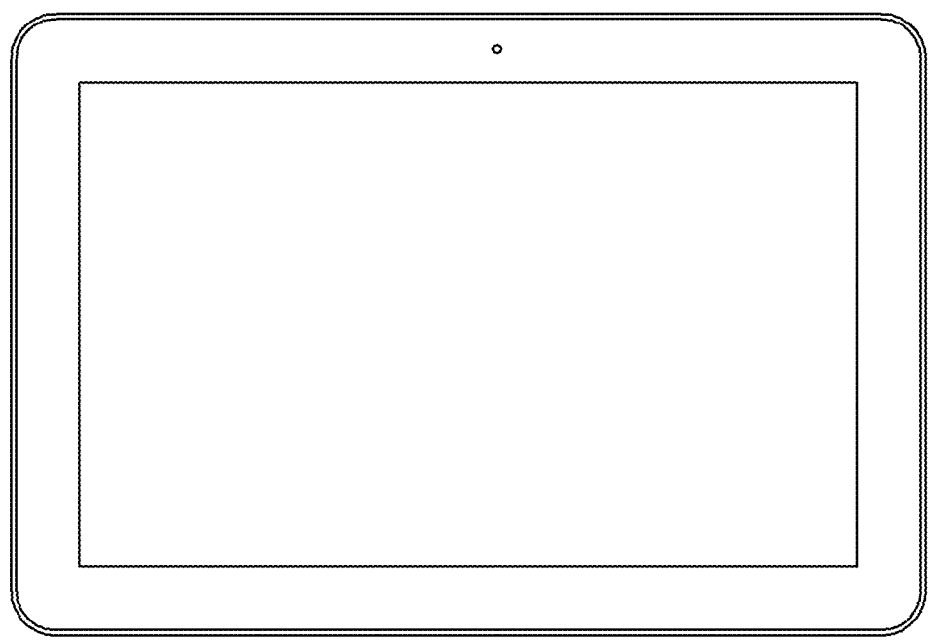
FIGS. 19 to 21 illustrate exemplary semiconductor systems which may adopt a semiconductor device according to some exemplary implementation.
Figure 21:
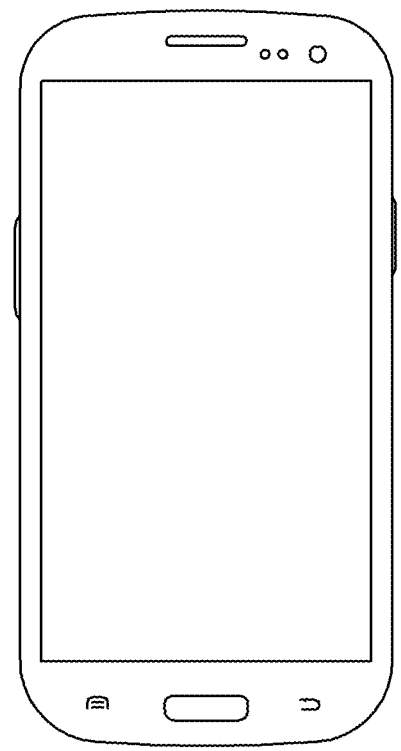

FIGS. 19 and 21 illustrate exemplary semiconductor systems which may apply therein a semiconductor device according to the described exemplary implementations.

Figure 20:
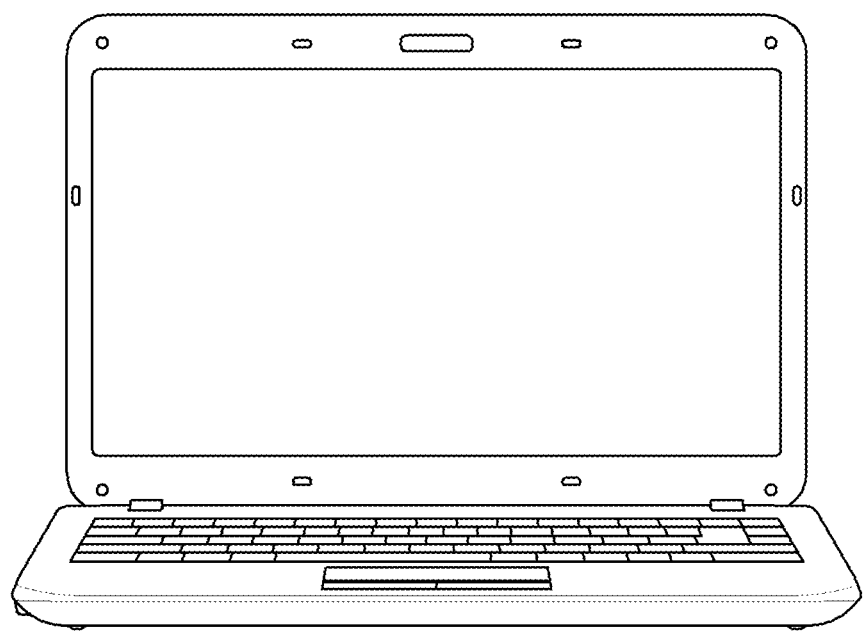

FIG. 19 illustrates a tablet PC 1200, FIG. 20 illustrates a laptop computer 1300, and FIG. 21 illustrates a smartphone 1400. According to the exemplary implementations explained above, the semiconductor device may be used in these devices, i.e., in the tablet PC 1200, the laptop computer 1300 or the smartphone 1400.

Further, it is apparent to those skilled in the art that the semiconductor device according to exemplary implementations described above is applicable to other integrated circuit devices not illustrated herein.

That is, while only the tablet PC 1200, the laptop computer 1300 and the smartphone 1400 are exemplified herein as a semiconductor system according to the exemplary implementations, the exemplary implementations of the semiconductor system are not limited to the examples given above.

In some exemplary implementations, the semiconductor system may be realized as a computer, a ultra mobile PC (UMPC), a workstation, a net-book, personal digital assistants (PDA), a portable computer, a wireless phone, a mobile phone, an e-book, a portable multimedia player (PMP), a portable game player, a navigation device, a black box, a digital camera, a three-dimensional television, a digital audio recorder, a digital audio player, a digital picture recorder, a digital picture player, a digital video recorder, a digital video player, and so on.

While the present subject matter concepts have been particularly shown and described with reference to exemplary implementations thereof, it will be understood by those of ordinary skill in the art that various changes in form and details may be made therein without departing from the spirit and scope of the present exemplary implementations of the subject matter concepts as defined by the following claims. It is therefore desired that the present implementations be considered in all respects as illustrative and not restrictive, reference being made to the appended claims rather than the foregoing description to indicate the scope of the invention.

What is claimed is:

1. A semiconductor device, comprising:
a deep trench defining an active region;
the active region comprising a protruding fin-type pattern comprising a lower portion, an upper portion of a narrower width than the lower portion, and a first stepped portion formed at a boundary between the upper portion and the lower portion, the upper portion comprising a first upper portion, and a second upper portion on the first upper portion;
a first field insulating film surrounding the lower portion;
a second field insulating film formed on the first field insulating film and partially surrounding the first upper portion with the second upper portion extending above the second field insulating film; and
a gate electrode formed on the second insulating film, extending across the first and second fin-type patterns, and formed adjacent to a portion of sidewalls and a portion of an upper surface of the upper portion.

2. The semiconductor device of claim 1, wherein the fin-type pattern comprises first and second side surfaces opposed to each other, and the fin-type pattern at the second side surface does not contact the second field insulating film.

3. The semiconductor device of claim 1, wherein the first and the second field insulating films have different stress characteristics from each other.

4. The semiconductor device of claim 1, further comprising a liner formed along a surface of the fin-type pattern.

5. The semiconductor device of claim 1, wherein the fin-type pattern comprises first and second side surfaces opposed to each other, and
a height of the first stepped portion at the first side surface is different from the height of the first stepped portion at the second side surface.

6. The semiconductor device of claim 5, wherein the fin-type pattern is inclined to a direction of the second side surface.

7. The semiconductor device of claim 1, wherein the first field insulating film and the second field insulating film comprise a same material as each other.

8. The semiconductor device of claim 7, wherein the first and the second field insulating films comprise $SiO_2$.

9. The semiconductor device of claim 1, wherein the second upper portion has a narrower width than the first upper portion, and wherein the upper portion of the fin-type pattern comprises a second stepped portion at a boundary between the first upper portion and the second upper portion.

10. The semiconductor device of claim 9, wherein the fin-type pattern comprises first and second side surfaces opposed to each other, and
a height of the second stepped portion at the first side surface is different from the height of the second stepped portion at the second side surface.

11. The semiconductor device of claim 9, wherein the first field insulating film surrounds the first upper portion, while exposing the second upper portion.

12. A semiconductor device, comprising:
a deep trench defining an active region;
first and second fin-type patterns protruding on the active region;
a first trench formed between the first and the second fin-type patterns and comprising a lower portion and an upper portion, and a stepped portion at a boundary between the upper portion and the lower portion;
a first field insulating film filling the lower portion;
a second field insulating film being on the first field insulating film and partially filling the upper portion; and
a gate electrode formed on the second insulating film, extending across the first and second fin-type patterns, and formed adjacent to a portion of sidewalls and a portion of an upper surface of the upper portion.

13. The semiconductor device of claim 12, further comprising:
a first source/drain formed on the first fin-type pattern, on opposite sides of the gate electrode;
a second source/drain formed on the second fin-type pattern, on opposite sides of the gate electrode;
a first contact electrically connected on the first source/drain; and
a second contact electrically connected on the second source/drain.

14. The semiconductor device of claim 12, wherein the gate electrode comprises a first metal layer formed conformally on the second field insulating film, and the first and the second fin-type patterns, and a second metal layer formed on the first metal layer.

15. The semiconductor device of claim 12, wherein an upper portion of the first trench comprises a first upper portion filled with a second field insulating film, and a second upper portion not filled with the second field insulating film.

16. The semiconductor device of claim 12, wherein the gate electrode comprises an end closer to the second fin-type pattern than to the first fin-type pattern, and the second fin-type pattern is inclined to a direction of the first fin-type pattern.

17. The semiconductor device of claim 12, wherein a width of the lower portion of the first trench is smaller than a width of the upper portion of the first trench.

18. The semiconductor device of claim 12, further comprising a gate insulating film between the gate electrode, and the first and the second fin-type patterns.

19. The semiconductor device of claim 12, wherein the second fin-type pattern is inclined in a direction farther away from the first fin-type pattern.

20. The semiconductor device of claim 12, wherein the first insulating film is in contact with the second field insulating film.

* * * * *